United States Patent
Kakamu

(10) Patent No.: US 9,231,577 B2
(45) Date of Patent: Jan. 5, 2016

(54) COMPARATOR

(71) Applicant: SOCIONEXT INC., Yokohama-shi, Kanagawa (JP)

(72) Inventor: Tomoya Kakamu, Gifu (JP)

(73) Assignee: SOCIONEXT INC., Yokohama (JP)

( * ) Notice: Subject to any disclaimer, the term of this patent is extended or adjusted under 35 U.S.C. 154(b) by 15 days.

(21) Appl. No.: 14/227,806

(22) Filed: Mar. 27, 2014

(65) Prior Publication Data

US 2014/0333347 A1    Nov. 13, 2014

(30) Foreign Application Priority Data

May 9, 2013    (JP) ................................. 2013-099499

(51) Int. Cl.
*H03K 5/22* (2006.01)
*H03K 5/24* (2006.01)

(52) U.S. Cl.
CPC ..................................... *H03K 5/249* (2013.01)

(58) Field of Classification Search
CPC ... H03K 5/2481; H03K 5/249; H03K 5/2418; H04L 25/0272; H03F 3/45183
USPC ................................................ 327/65, 74–76
See application file for complete search history.

(56) References Cited

U.S. PATENT DOCUMENTS

| | | | | |
|---|---|---|---|---|
| 5,949,280 | A * | 9/1999 | Sasaki | 329/303 |
| 8,199,043 | B2 * | 6/2012 | Van der Plas et al. | 341/161 |
| 8,390,499 | B2 * | 3/2013 | Ito | 341/159 |

FOREIGN PATENT DOCUMENTS

| | | |
|---|---|---|
| JP | 6-224764 A | 8/1994 |
| JP | 2010-045622 A | 2/2010 |
| JP | 2013187695 A * | 9/2013 |

* cited by examiner

*Primary Examiner* — Quan Tra
(74) *Attorney, Agent, or Firm* — Arent Fox LLP

(57) ABSTRACT

A comparator includes a first comparison unit configured to compare an input signal with a first signal and a second comparison unit configured to compare the input signal with a second signal having a voltage value lower than a voltage value of the first signal in a case where a voltage value of the input signal is lower than the voltage value of the first signal and compare the input signal with a third signal having a voltage value higher than a voltage value of the first signal in a case where a voltage value of the input signal is higher than the voltage value of the first signal.

5 Claims, 16 Drawing Sheets

FIG.7

| Relationships among input voltages | CK | XD0 | XD3 | XD1 | XD2 | Nonterminal Node Logic DO0 | DO3 | DO1 | DO2 | Output Logic D1 | D0 |
|---|---|---|---|---|---|---|---|---|---|---|---|
| Vin < VR1 < VR2 < VR3 | ↑(H) | L | H | H | L | H | L | L | H | L | L |
| Vin < VR1 < VR2 < VR3 | L | H | H | H | H | H (HOLD) | L (HOLD) | L (HOLD) | H (HOLD) | | |
| VR1 < Vin < VR2 < VR3 | ↑(H) | H | L | H | L | L | H | L | H | L | H |
| VR1 < Vin < VR2 < VR3 | L | H | H | L | H | L (HOLD) | H (HOLD) | L (HOLD) | H (HOLD) | | |
| VR1 < VR2 < Vin < VR3 | ↑(H) | H | L | L | H | L | H | H | L | H | L |
| VR1 < VR2 < Vin < VR3 | L | H | H | L | H | L (HOLD) | H (HOLD) | H (HOLD) | L (HOLD) | | |
| VR1 < VR2 < VR3 < Vin | ↑(H) | L | H | H | H | H (HOLD) | L (HOLD) | H | L | H | H |
| VR1 < VR2 < VR3 < Vin | L | H | H | H | H | H (HOLD) | L (HOLD) | H (HOLD) | L (HOLD) | | |

FIG.11

| RELATIONSHIPS AMONG INPUT VOLTAGES | CK | OUTPUT LOGIC | |
|---|---|---|---|
| | | D1 | D0 |
| Vin < VR1 < VR2 < VR3 | ↑ | L | L |
| VR1 < Vin < VR2 < VR3 | ↑ | L | H |
| VR1 < VR2 < Vin < VR3 | ↑ | H | L |
| VR1 < VR2 < VR3 < Vin | ↑ | H | H |

FIG.13

| RELATIONSHIPS AMONG INPUT VOLTAGES | CK | NONTERMINAL NODE LOGIC | | | |
|---|---|---|---|---|---|
| | | XD0 | XD3 | XD1 | XD2 |
| Vin < VR1 < VR2 < VR3 | ↓(L) | L | H | H | L |
| | H | L | L | L | L |
| VR1 < Vin < VR2 < VR3 | ↓(L) | H | L | H | L |
| | H | L | L | L | L |
| VR1 < VR2 < Vin < VR3 | ↓(L) | H | L | L | H |
| | H | L | L | L | L |
| VR1 < VR2 < VR3 < Vin | ↓(L) | L | H | L | H |
| | H | L | L | L | L |

COMPARATOR

CROSS-REFERENCE TO RELATED APPLICATIONS

This application claims the benefit of priority to Japanese Application No. 2013-099499 filed on May 9, 2013, the entire contents of which are herein incorporated by reference.

FIELD

A certain aspect of the embodiments discussed herein relates to a comparator.

BACKGROUND

Conventionally, there is a signal detection device for detecting an input signal that includes noise. This signal detection device has N comparison units for comparing respective N parallel input signals (wherein N is a natural number equal to or greater than 2) with threshold values, respectively, and a computing unit for computing the number N+ of comparison units with the respective input signals greater than the threshold values. This signal detection device further has analysis means for computing a ratio N+/N of the number N+ of comparison units with the respective input signals greater than the threshold values to the number N of elements of the comparison units, based on an output from the computing unit, and estimating waveforms of the input signals by using this ratio of N+/N and statistics of noise (see, for example, Japanese Patent Application Publication No. 2010-045622).

Because a conventional signal detection device as described above uses N comparison units for comparing input signals with N threshold values, respectively, for example, 3 comparison units are needed to compare input signals with 3 threshold values.

Thus, there is a problem of a high electric power consumption of a conventional signal detection device because N comparison units are used to compare input signals with N threshold values, respectively.

SUMMARY

According to an aspect of the embodiments, a comparator includes a first comparison unit configured to compare an input signal with a first signal and a second comparison unit configured to compare the input signal with a second signal having a voltage value lower than a voltage value of the first signal in a case where a voltage value of the input signal is lower than the voltage value of the first signal and compare the input signal with a third signal having a voltage value higher than a voltage value of the first signal in a case where a voltage value of the input signal is higher than the voltage value of the first signal.

The object and advantages of the invention will be realized and attained by means of the elements and combinations particularly pointed out in the claims.

It is to be understood that both the forgoing general description and the following detailed description are exemplary and explanatory and are not restrictive of the invention.

BRIEF DESCRIPTION OF THE DRAWING(S)

Figure 3:
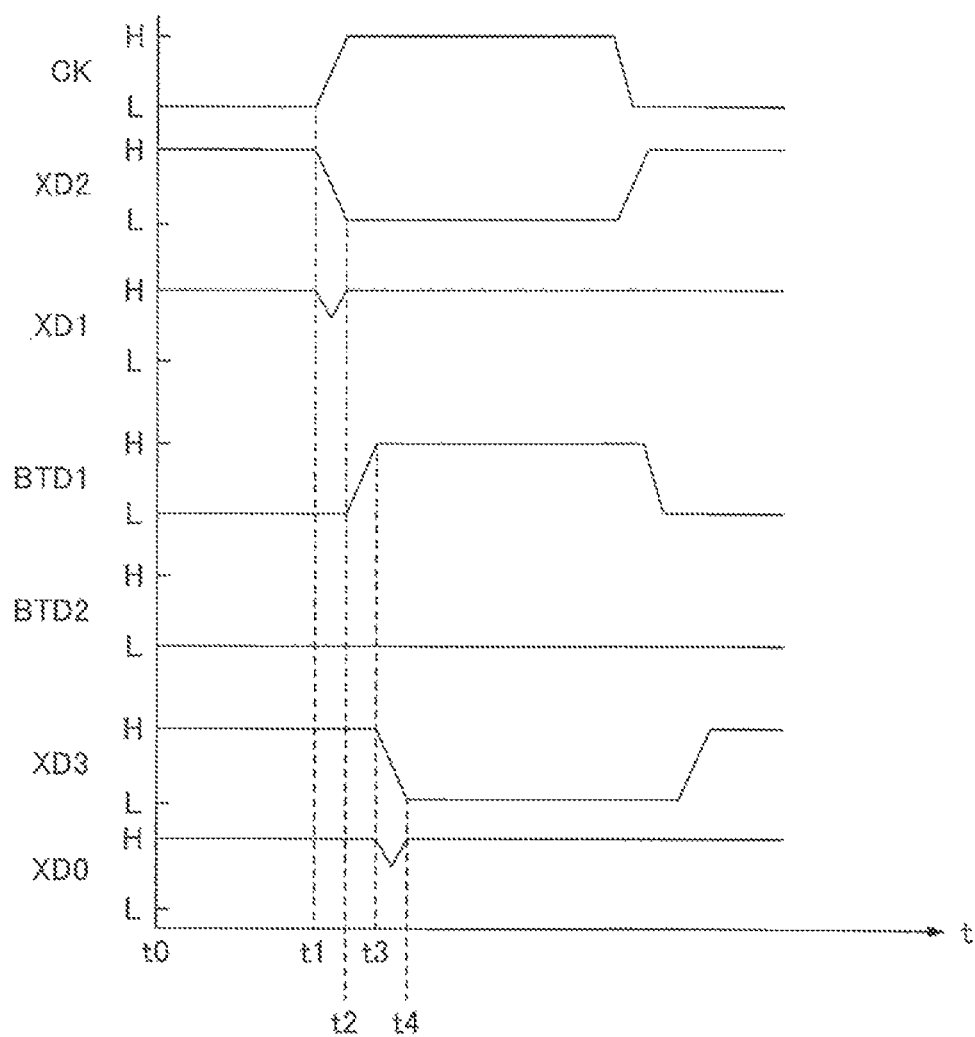
Figure 4:
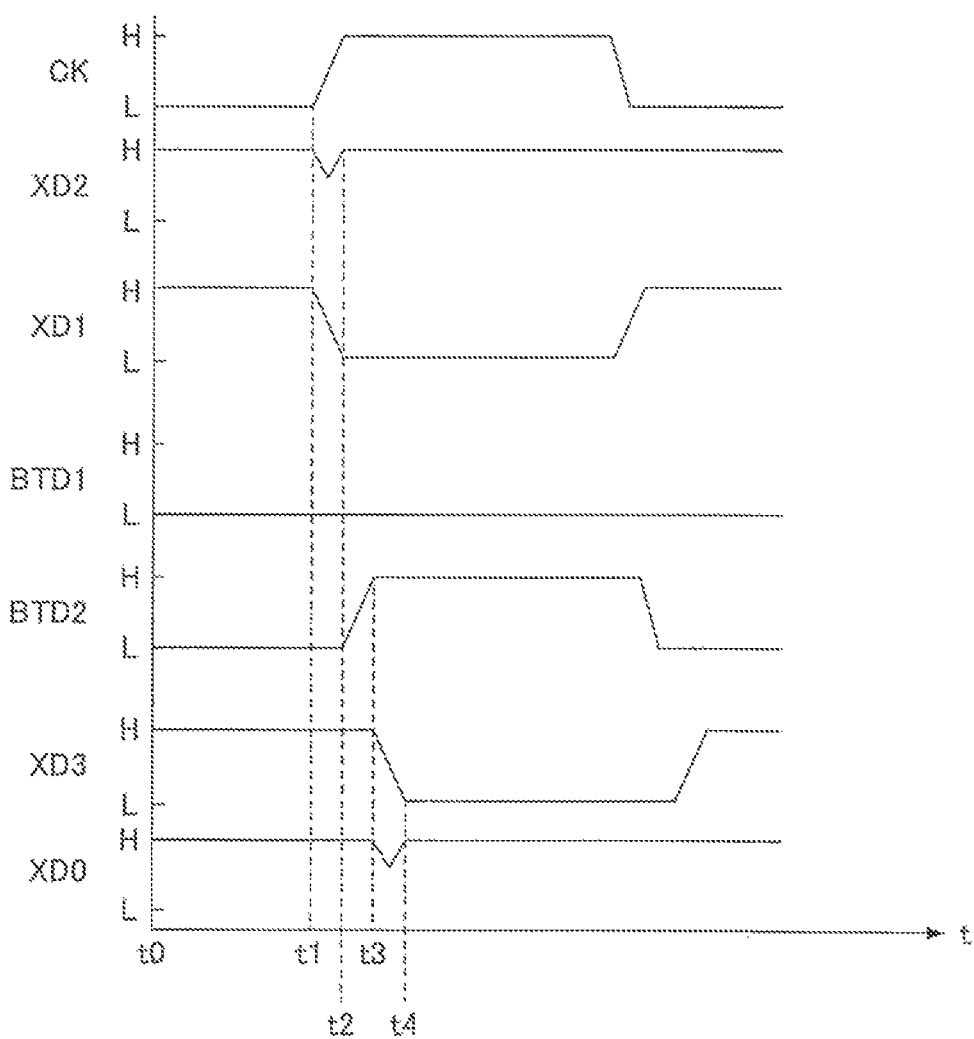
Figure 5:
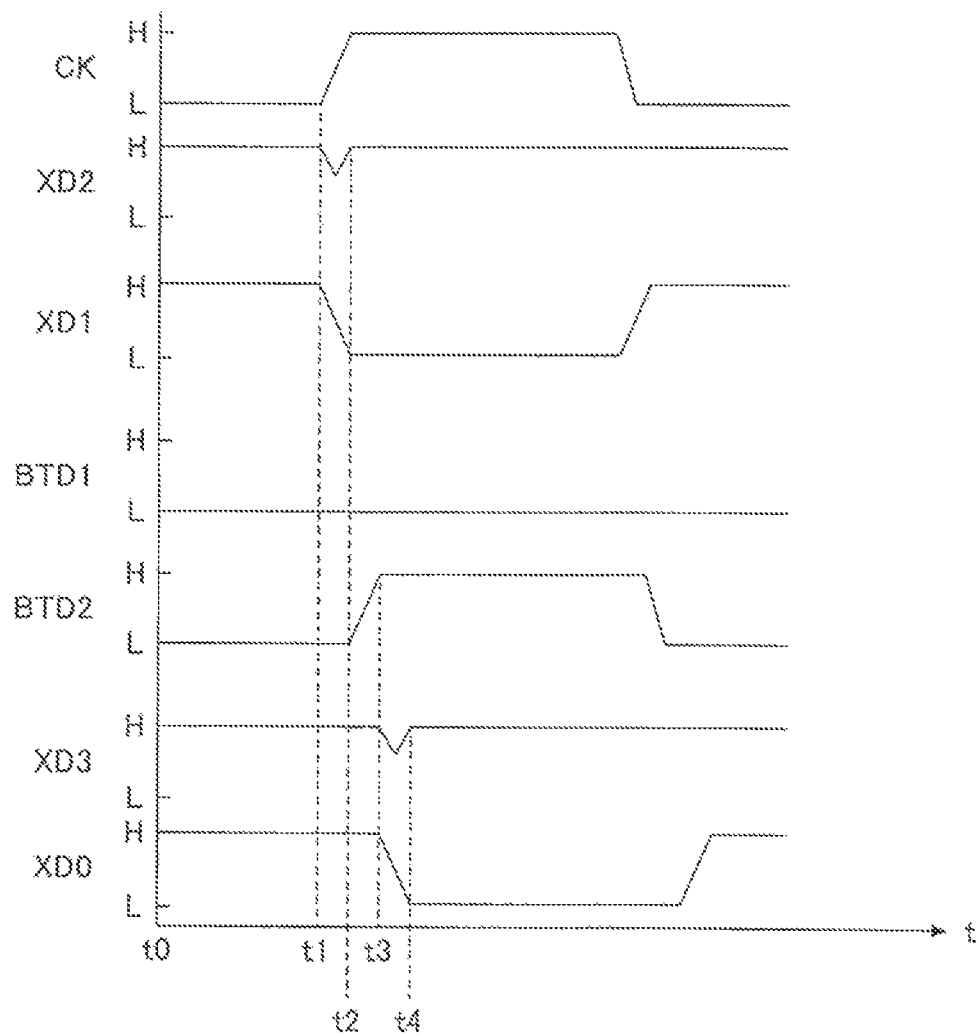
Figure 6:
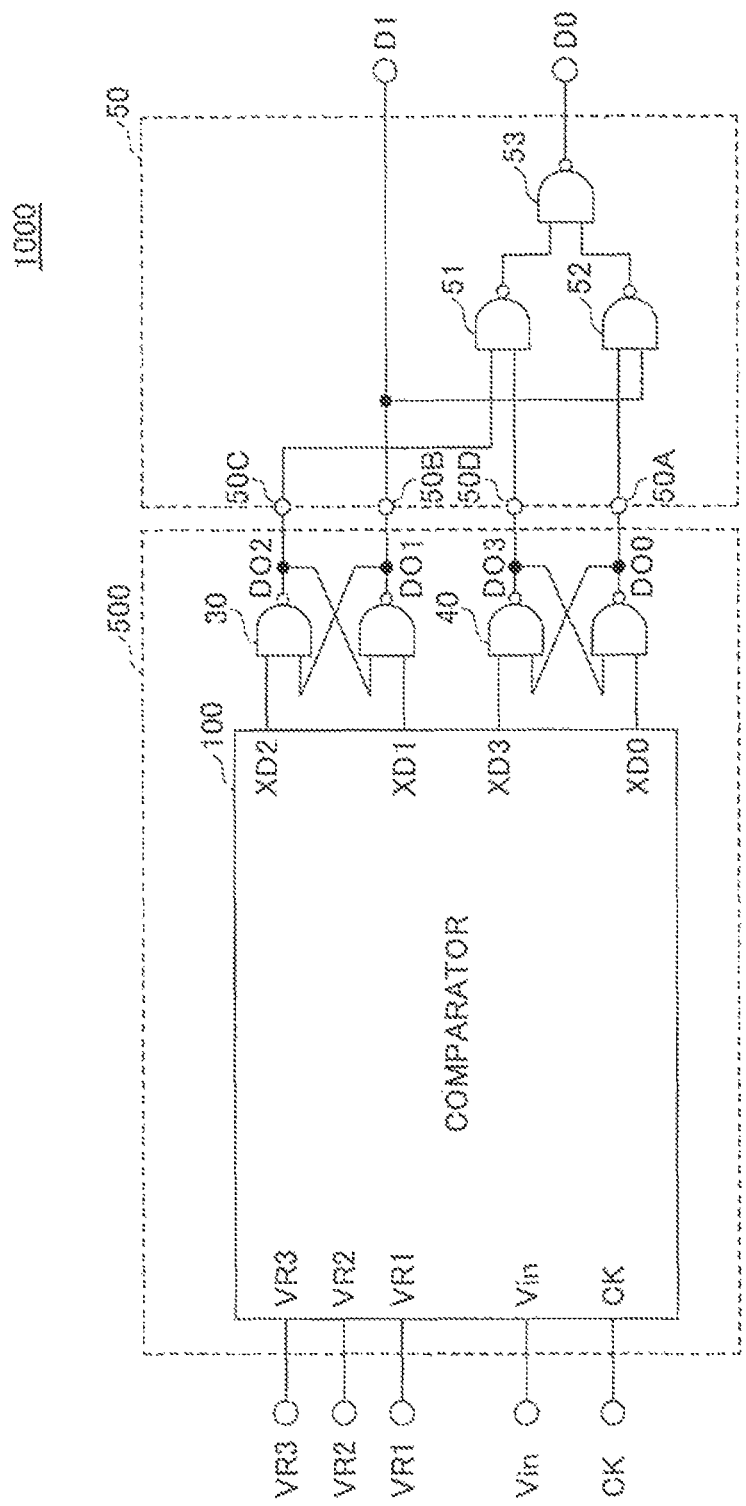
Figure 8:
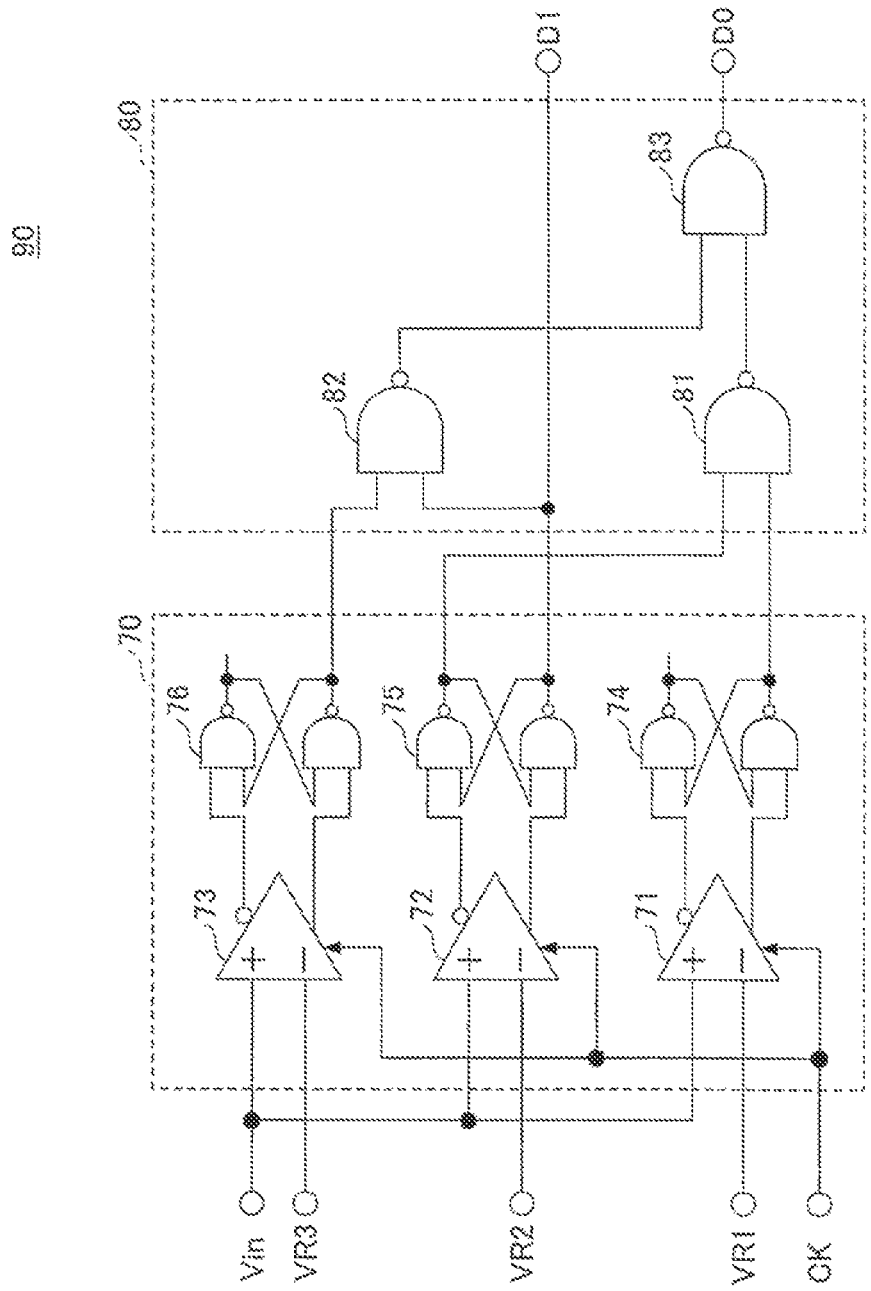
Figure 9:
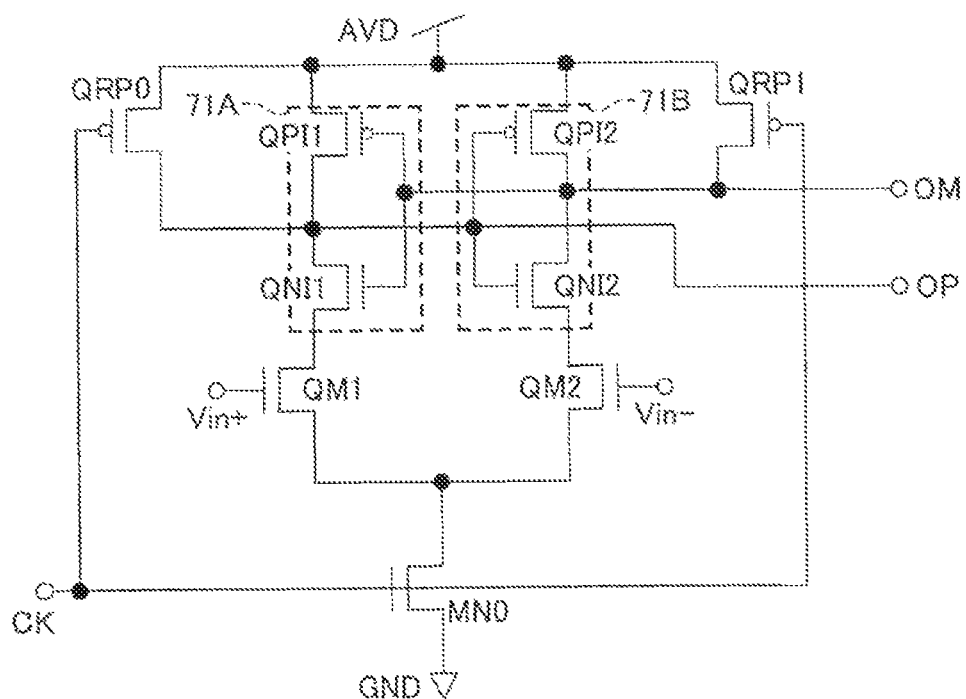
Figure 10:
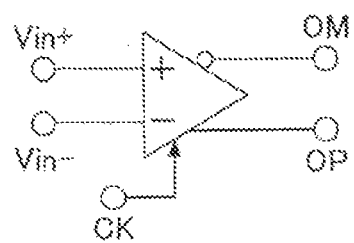
Figure 12:
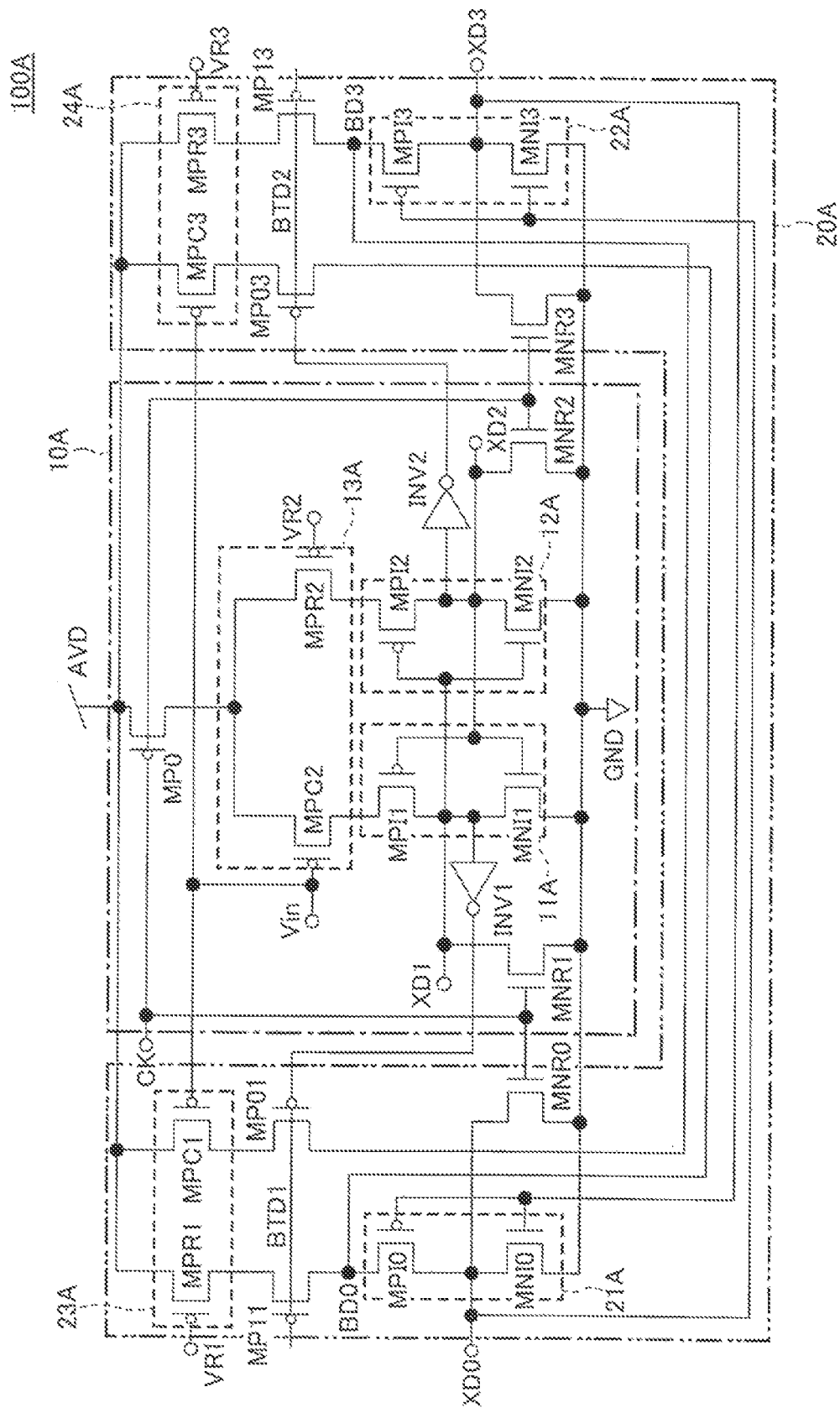
Figure 14:
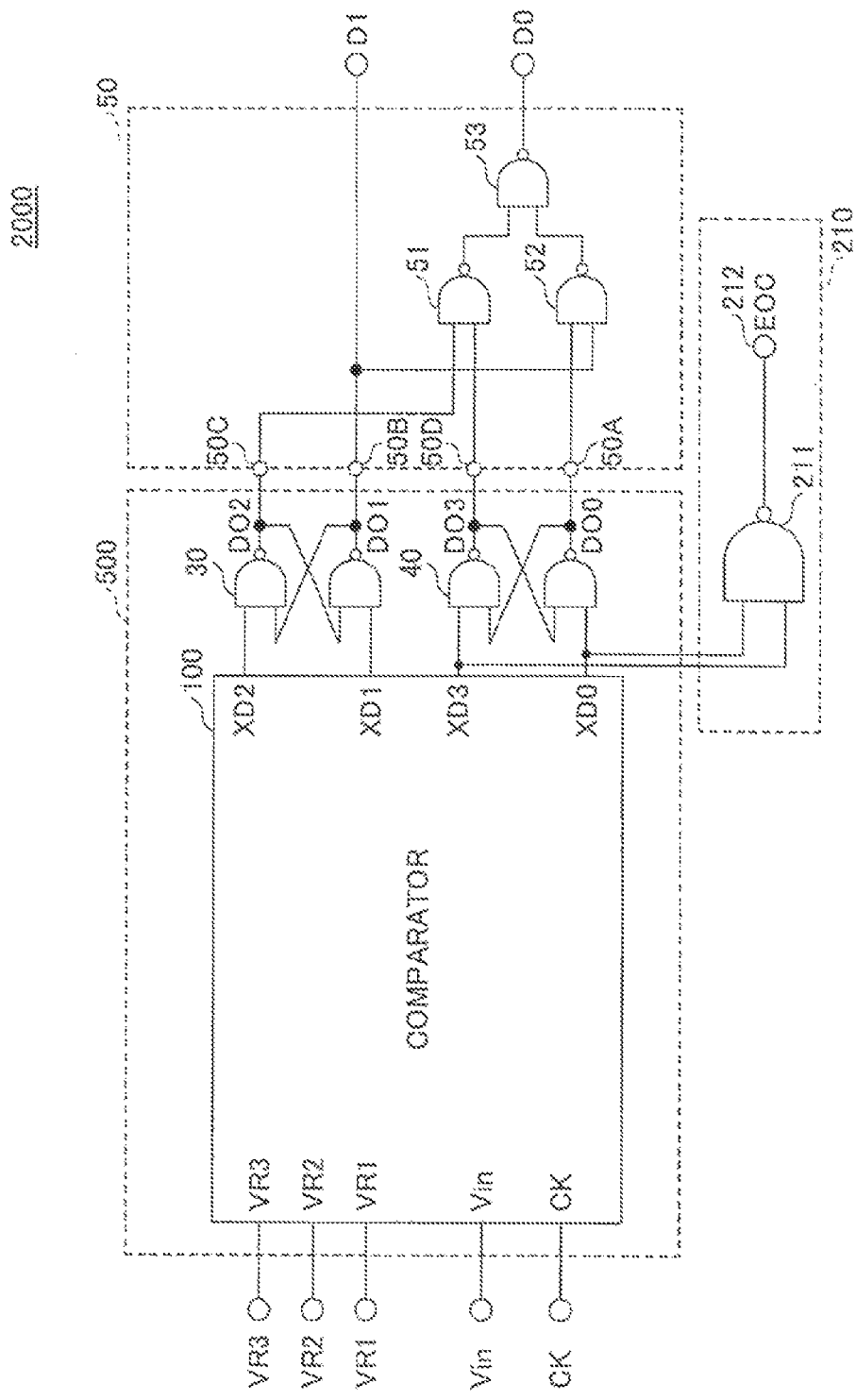
Figure 15:
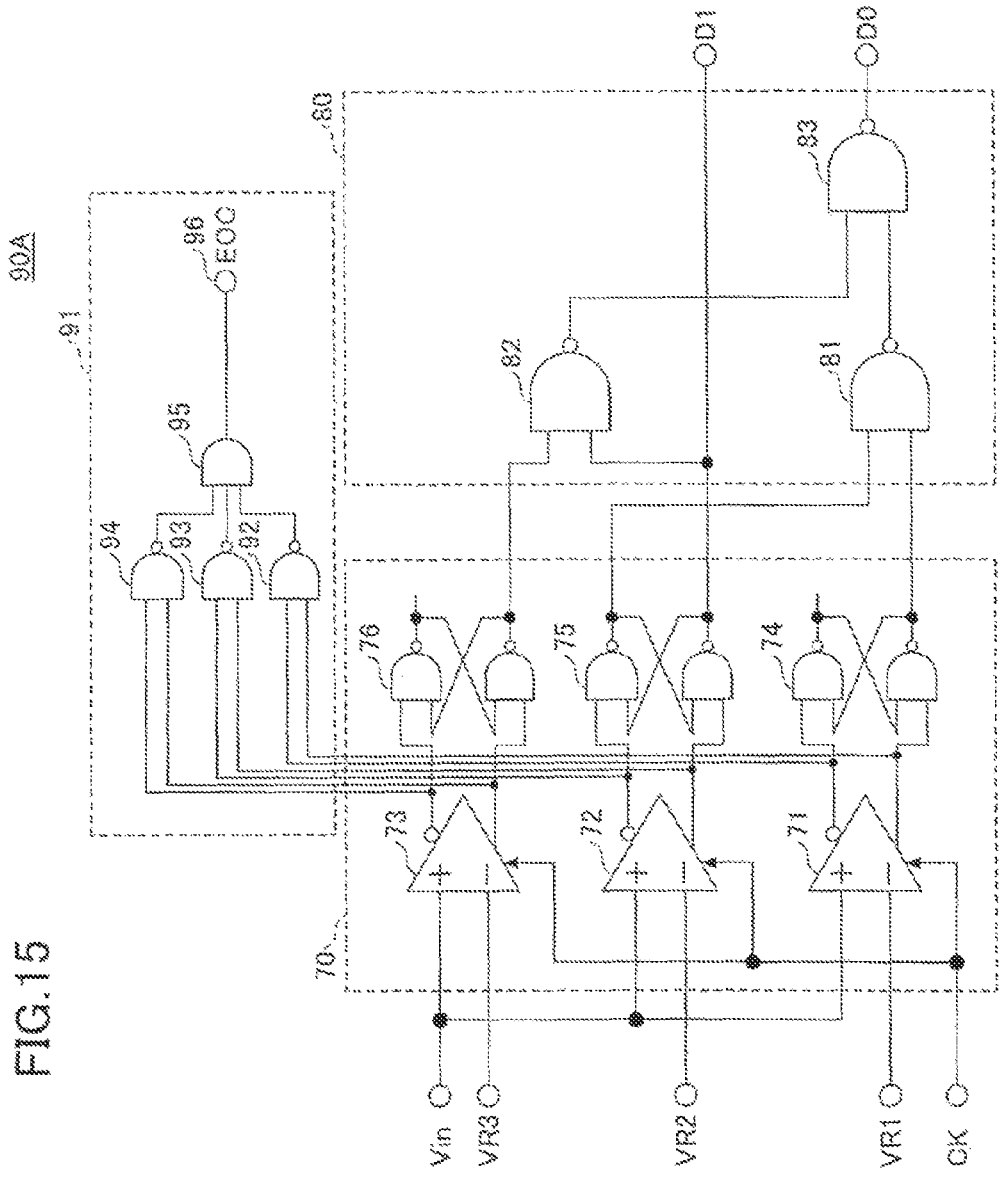
Figure 16:
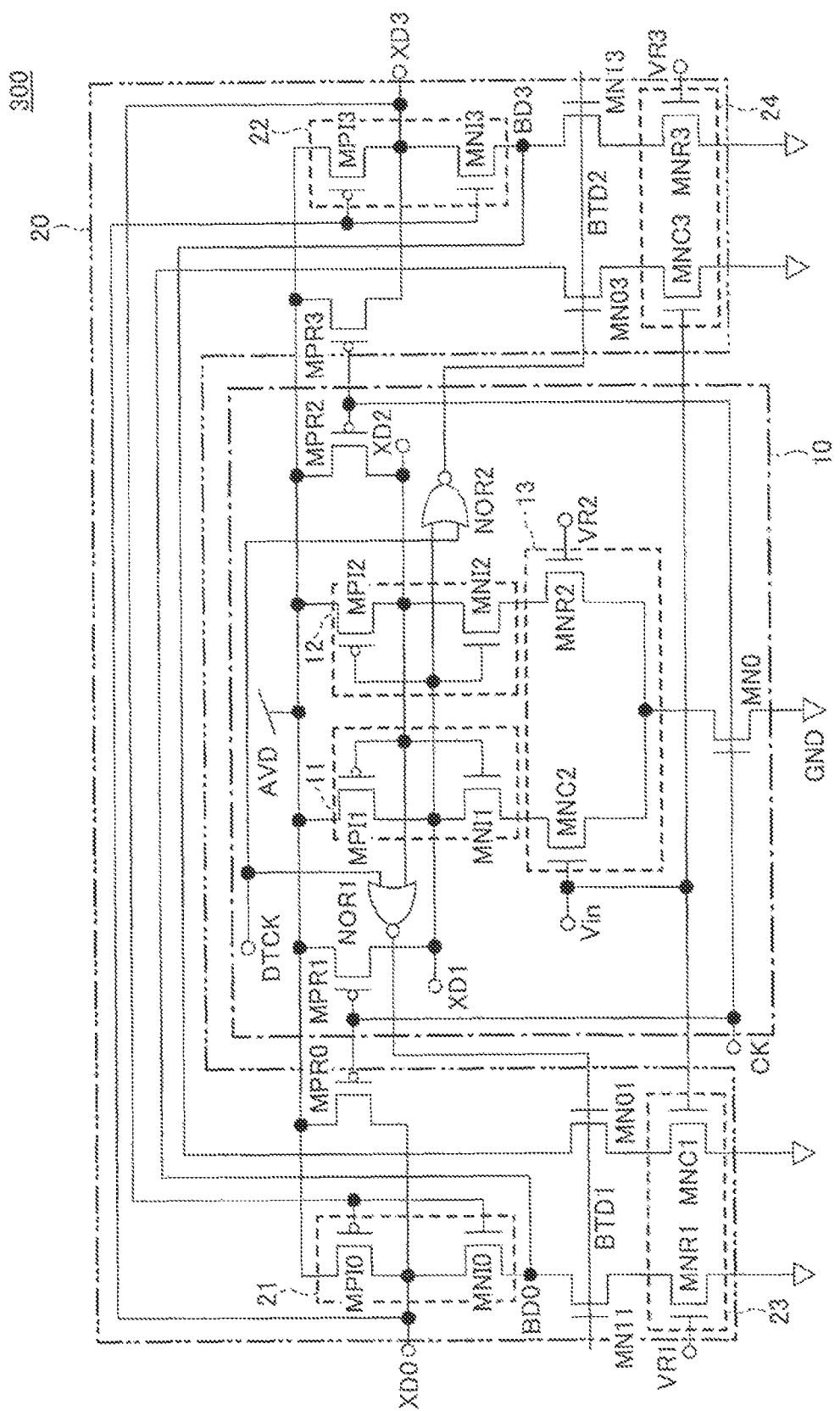

FIG. 3 as a timing chart illustrating an operation of the comparator 100 in the first embodiment;

FIG. 4 is a timing chart illustrating an operation of the comparator 100 in the first embodiment;

FIG. 5 is a timing chart illustrating an operation of the comparator 100 in the first embodiment;

FIG. 6 is a diagram illustrating a configuration of a comparator circuit 1000 including the comparator 100 in the first embodiment;

FIG. 7 is a diagram illustrating output levels obtained by the comparator 100, NAND-type latch circuits 30 and 40, and an encoding part 50 in an embodiment;

FIG. 8 is a diagram illustrating a comparator circuit 90 for comparison;

FIG. 9 is a diagram illustrating a circuit configuration of a comparator 71;

FIG. 10 is a diagram illustrating the comparator 71 by symbols;

FIG. 11 is a diagram illustrating outputs of the comparator circuit 90 for comparison;

FIG. 12 is a diagram illustrating a circuit configuration of a comparator 100A in an variation example of the first embodiment;

FIG. 13 it a diagram illustrating nonterminal node logics XD0, XD1, XD2, and XD3 of the comparator 100A in the variation example of the first embodiment;

FIG. 14 is a diagram illustrating a comparator circuit 2000 in a second embodiment;

FIG. 15 is a diagram illustrating a comparator circuit 90A for comparison;

FIG. 16 is a diagram illustrating a comparator 300 in a third embodiment; and

Figure 17:
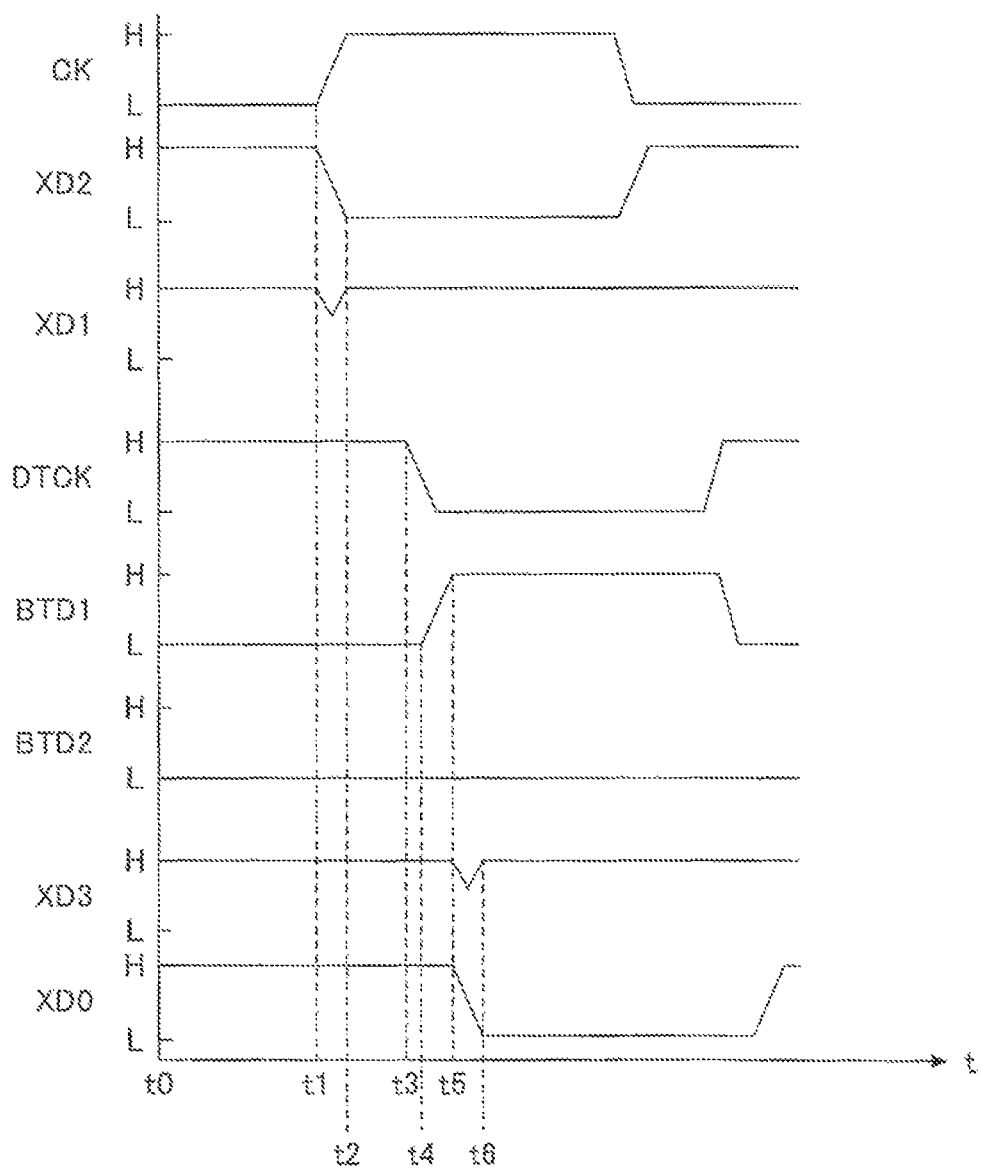

FIG. 17 is a timing chart illustrating an operation of the comparator 300 in the third embodiment.

DESCRIPTION OF EMBODIMENT(S)

Embodiments will be described below, wherein a comparator in the present invention is applied thereto.

First Embodiment

Figure 1:
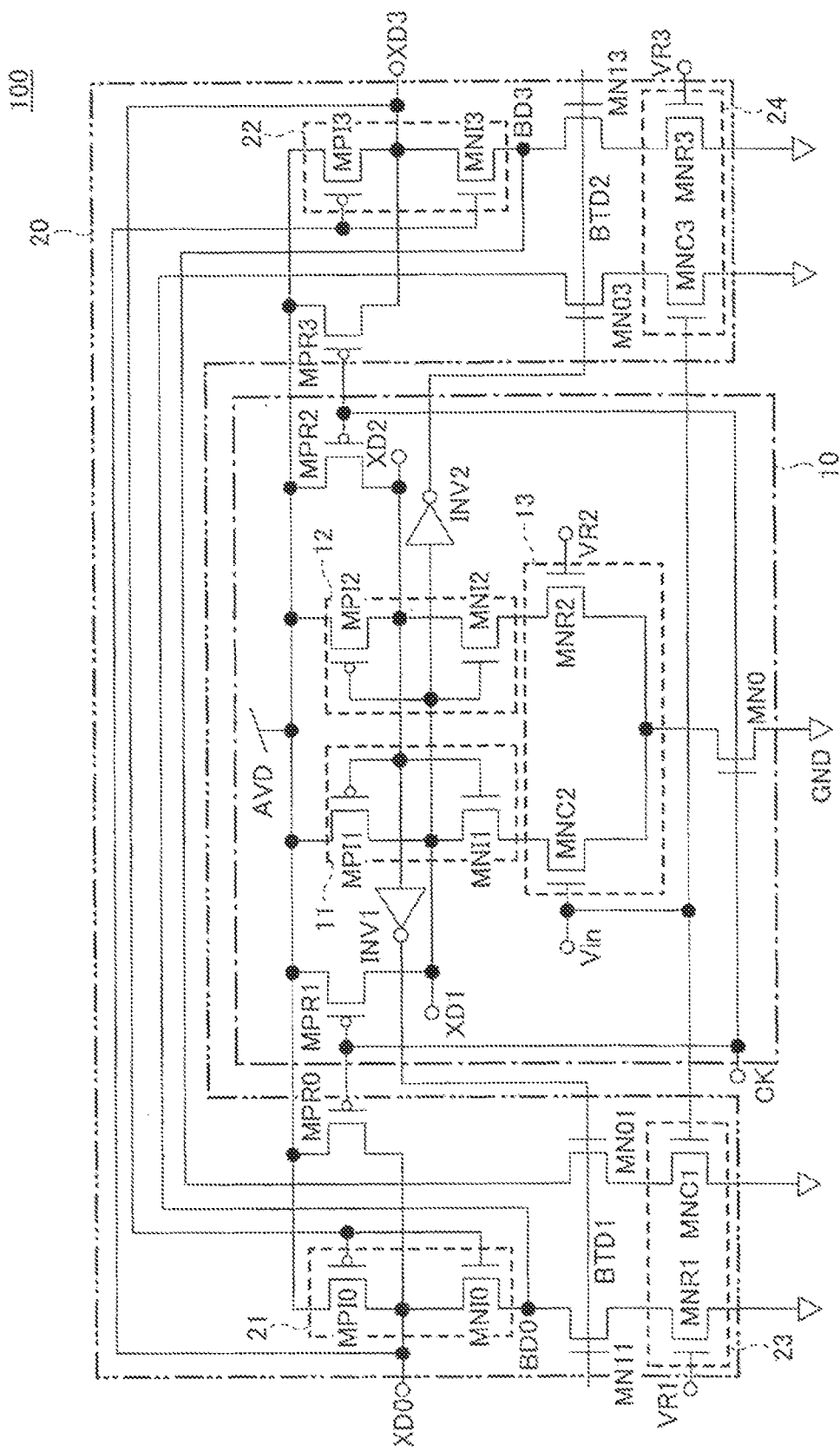
FIG. 1 is a diagram illustrating a circuit configuration of a comparator 100 in a first embodiment.

FIG. 1 is a diagram illustrating a circuit configuration of a comparator 100 in a first embodiment.

In the following, a P-channel-type transistor is denoted by a symbol including MP and an N-channel-type transistor is denoted by a symbol including MN. Here, GND denotes ground.

The comparator 100 in the first embodiment includes an input terminal Vin, reference terminals VR1, VR2, and VR3, output terminals XD0, XD1, XD2, and XD3, a clock input terminal CK, and an electric power terminal AVD.

The comparator 100 further includes reset switches MPR0, MPR1, MPR2, and MPR3, and a switch MN0.

The comparator 100 further includes a pair of inverters 11 and 12 that are connected to provide positive feedback thereto, a differential pair circuit 13, and inverters INV1 and INV2. The inverter 11 has transistors MPI1 and MNI1 and the inverter 12 has transistors MPI2 and MNI2. Furthermore, the differential pair circuit 13 includes transistors MNC2 and MNR2.

Herein, the inverters 11 and 12, the differential pair circuit 13, the inverters INV1 and INV2, the switch MN0, and the reset switches MPR1 and MPR2 constitutes a comparator part 10. The comparator part 10 is one example of a first comparison unit.

The comparator 100 further includes a pair of inverters 21 and 22 that are connected to provide positive feedback thereto, switches MN01, MN11, MN03, MN13, and differential pair circuits 23 and 24.

The inverter 21 has transistors MPI0 and MNI0. The inverter 22 has transistors MPI3 and MNI3. The differential pair circuit 21 has transistors MNR1 and MNC1. The differential pair circuit 24 has transistors MNR3 and MNC3.

Herein, the inverters 21 and 22, the switches MN01, MN11, MN03, and MN13, the differential pair circuits 23 and 24, and the reset switches MPR0 and MPR3 constitute a comparator part 20. The comparator part 20 is one example of a second comparison unit.

The input terminal Vin is connected to a gate of the transistor MNC2 of the differential pair circuit 13, a gate of the transistor MNC1 of the differential pair circuit 23, and a gate of the transistor MNC3 of the differential pair circuit 24. The input terminal Vin is an input terminal of the comparator 100.

The reference terminals VR1, VR2, and VR3 are connected to a gate of the transistor MNR1 of the differential pair circuit 23, a gate of the transistor MNR2 of the differential pair circuit 13, and a gate of the transistor VR3 of the differential pair circuit 24, respectively.

Reference voltages VR1, VR2, and VR3 are inputted to the reference terminals VR1, VR2, and VR3, respectively. There is a relationship of VR1<VR2<VR3 among the reference voltages VR1, VR2, and VR3.

The reference voltages VR1, VR2, and VR3 are three reference voltages for the comparator 100 and voltages that are references for comparison with the input voltage Vin. The reference voltage VR2 is one example of a first signal, the reference voltage VR1 is one example of a second signal, and the reference voltage VR3 is one example of a third signal.

The output terminal XD0 is connected to an output terminal of the inverter 21. That is, the output terminal XD0 is connected to a drain of the transistor MPI0 of the inverter 21 and a drain of the transistor MNI0 thereof.

Furthermore, the output terminal XD0 is connected to an input terminal of the inverter 22. That is, the output terminal XD0 is connected to a gate of the transistor MPI3 of the inverter 22 and a gate of the transistor MNI3 thereof.

Furthermore, the output terminal XD0 is connected to a drain of the reset switch MPR0.

The output terminal XD1 is connected to an output terminal of the inverter 11. That is, the output terminal XD1 is connected to a drain of the transistor MPI1 of the inverter 11 and a drain of the transistor MNI1 thereof.

Furthermore, the output terminal XD1 is connected to an input terminal of the inverter 12. That is, the output terminal XD1 is connected to a gate of the transistor MPI2 of the inverter 12 and a gate of the transistor MNI2 thereof.

Furthermore, the output terminal XD1 is connected to a drain of the reset switch MPR1 and an input terminal of the inverter INV2.

The output terminal XD0 is connected to an output terminal of the inverter 12. That is, the output terminal XD2 is connected to a drain of the transistor MPI2 of the inverter 11 and a drain of the transistor MNI2 thereof.

Furthermore, the output terminal XD2 is connected to an input terminal of the inverter 11. That is, the output terminal XD2 is connected to a gate of the transistor MPI1 of the inverter 11 and a gate of the transistor MNI1 thereof.

Furthermore, the output terminal XD2 is connected to a drain of the reset switch MPR2 and an input terminal of the inverter INV1.

The output terminal XD3 is connected to an output terminal of the inverter 22. That is, the output terminal XD3 is connected to a drain of the transistor MPI3 of the inverter 22 and a drain of the transistor MNI3 thereof.

Furthermore, the output terminal XD3 is connected to an input terminal of the inverter 21. That is, the output terminal XD3 is connected to a gate of the transistor MPI0 of the inverter 21 and a gate of the transistor MNI0 thereof.

Furthermore, the output terminal XD3 is connected to a drain of the reset switch MPR3.

Herein, the output terminals XD1 and XD2 of the comparator part 10 are one example of a pair of first terminals and the output terminals XD0 and XD3 of the comparator part 20 are one example of a pair of second terminals.

The clock input terminal CK is connected to a gate of each of the switch MN0 and the reset switches MPR0, MPR1, MPR2, and MPR3. A reference clock for operating the comparator 100 is inputted to the clock input terminal CK.

The electric power terminal AVD is an electric power input terminal where an analog electric power is inputted from an electric power source. The electric power terminal AVD is connected to a source of each of the transistors MPI0, MPI1, MPI2, and MPI3, and the reset switches MPR0, MPR1, MPR2, and MPR3.

A source of each of the reset switches MPR0, MPR1, MPR2, and MPR3 is connected to the electric power terminal AVD. A gate of each of the reset switches MPR0, MPR1, MPR2, and MPR3 is connected to the clock input terminal CK.

A drain of the reset switch MPR0 is connected to an output terminal of the inverter 21, an input terminal of the inverter 22, and the output terminal XD0.

A drain of the reset switch MPR1 is connected to the output terminal XD1, an output terminal of the inverter 11, an input terminal of the inverter 12, and an input terminal of the inverter INV2.

A drain of the reset switch MPR2 is connected to the output terminal XD2, an output terminal of the inverter 12, an input terminal of the inverter 11, and an input terminal of the inverter INV1.

A drain of the reset switch MPR2 is connected to an output terminal of the inverter 22, an input terminal of the inverter 21, and the output terminal XD3.

The switch MN0 is such that a gate is connected to the clock input terminal CK, a drain is connected to a common terminal (sources of the transistor MNC2 and MNR2) of the differential pair circuit 13 and a source is connected to be grounded. The switch MN0 is one example of a third switch.

The inverters 11 and 12 are connected to provide positive feedback thereto, by connecting mutual input terminals and output terminals. The inverters 11 and 12 are one example of a pair of first inverters connected to provide positive feedback thereto.

The inverter 11 has the transistors MPI1 and MNI1 and the inverter 12 has the transistors MPI2 and MNI2.

A source of the transistor MPI1 of the inverter 11 is connected to the electric power terminal AVD and a source of the transistor MNI1 is connected to a drain of the transistor MNC2 of the differential pair circuit 13.

A source of the transistor MPI2 of the inverter 12 is connected to the electric power terminal AVD and a source of the transistor MNI2 is connected to a drain of the transistor MNR2 of the differential pair circuit 13.

The differential pair circuit 13 includes the transistors MNC2 and MNR2. A gate of the transistor MNC2 is connected to the input terminal Vin and a source thereof is connected to a source of the transistor MNR2 and connected to a drain of the switch MN0. A gate of the transistor MNR2 is connected to the reference terminal VR2 and a source thereof is connected to a source of the transistor MNC2 and connected to a drain of the switch MN0. The differential pair circuit 13 is one example of a first differential pair circuit.

The inverter INV1 is such that an input terminal is connected to a drain of the reset switch MPR2 and an output terminal of the inverter 12 and an output terminal is connected to gates of the switches MN01 and MN11.

The inverter INV2 is such that an input terminal is connected to a drain of the reset switch MPR1 and an output terminal of the inverter 11 and an output terminal is connected to gates of the switches MN03 and MN13.

The inverters 21 and 22 are connected to provide positive feedback thereto, by connecting mutual input terminals and output terminals. The inverters 21 and 22 are one example of a pair of second inverters connected to provide feedback thereto.

The inverter 21 has the transistors MPI0 and MNI0 and the inverter 22 has the transistors MPI3 and MNI3.

A source of the transistor MPI0 of the inverter 21 is connected to the electric power terminal AVD and a source of the transistor MNI0 is connected to drains of the switches MN11 and MN03. Herein, a connection point between a source of the transistor MNI0 and drains of the switches MN11 and MN03 is referred to as a node BD0.

A source of the transistor MPI3 of the inverter 22 is connected to the electric power terminal AVD and a source of the transistor MNI3 is connected to drains of the switches MN13 and MN01. Herein, a connection point between a source of the transistor MNI3 and drains of the switches MN13 and MN01 is referred to as a node BD3.

The switch MN01 is such that a drain is connected to the node BD3, a gate is connected to an output of the inverter INV1, and a source is connected to a drain of the transistor MNC1 of the differential pair circuit 23.

The switch MN01 is such that a drain is connected to the node BD3, a gate is connected to an output of the inverter INV1, and a source is connected to a drain of the transistor MNC1 of the differential pair circuit 23. Here, a connection point between both gates of the switches MN01 and MN11 is referred to as a node BTD1. Furthermore, the switches MN01 and MN11 are one example of a pair of first switches.

The switch MN03 is such that a drain is connected to the node BD0, a gate is connected to an output of the inverter INV2, and a source is connected to a drain of the transistor MNC3 of the differential pair circuit 24.

The switch MN13 is such that a drain is connected to the node BD3, a gate is connected to an output of the inverter INV2, and a source is connected to a drain of the transistor MNR3 of the differential pair circuit 23. Here, a connection point between both gates of the switches MN03 and MN13 is referred to as a node BTD2. Furthermore, the MN03 and MN13 are one example of a pair of second switches.

The differential pair circuit 23 has the transistors MNR1 and MNC1. The transistor MNR1 is such that a drain is connected to a source of the switch MN11, a gate is connected to the reference terminal VR1, and a source is grounded. The differential pair circuit 23 is one example of a second differential pair circuit.

The transistor MNC1 is such that a drain is connected to a source of the switch MN01, a gate is connected to the input terminal Vin, and a source is grounded.

The differential pair circuit 24 has the transistors MNR3 and MNC3. The transistor MNR3 is such that a drain is connected to a source of the switch MN13, a gate is connected to the reference terminal VR3, and a source is grounded. The differential pair circuit 24 is one example of a third differential pair circuit.

The transistor is such that a drain is connected to a source of the switch MN03, a gate is connected to the input terminal Vin, and a source is grounded.

Although the description is herein provided in such a manner that the inverters INV1 and INV2 are included in components of the comparator part 10, the inverters INV1 and INV2 may not be included in the comparator part 10.

In this case, the inverters INV1 and INV2 are included in components of the comparator 20, or may not be included in components of the comparator parts 10 or 20.

Furthermore, the differential pair circuit 23 and the switches MN01 and MN11 are one example of a first comparison circuit that is included in the comparator part 20 as one example of a second comparison unit. Furthermore, the differential pair circuit 24 and the switches MN03 and MN13 are one example of a second comparison circuit that is included in the comparator part 20 as one example of a second comparison unit.

Next, an operation of the comparator 100 in the first embodiment will be described. Herein, the reference voltage VR2 is one example of a first voltage, the reference voltage VR1 is one example of a second voltage, and the reference voltage VR3 is one example of a third voltage. There is a relationship of VR1<VR2<VR3 among the reference voltages VR1, VR2, and VR3.

First, the comparator 100 compares the input voltage Vin with the reference voltage VR2 at a first step. This comparison at the first step is executed in the comparator part 10.

Then, the comparator 100 executes comparison at a second step, depending on a result of comparison at the first step. At the second step, the comparator 100 compares the input voltage Vin with the reference voltage VR1 lower than the reference voltage VR2 in a case where the input voltage Vin is lower than the reference voltage VR2, and compares the input voltage Vin with the reference voltage VR3 higher than the reference voltage VR2 in a case where the input voltage Vin is higher than the reference voltage VR2.

That is, in a case where the input voltage Vin is lower than the reference voltage VR2, the comparator 100 at the second step does not compare the input voltage Vin with the reference voltage VR3 higher than the reference voltage VR2 but compares the input voltage Vin with the reference voltage VR1 lower than the reference voltage VR2.

Furthermore, in a case where the input voltage Vin is higher than the reference voltage VR2, the comparator 100 at the second step does not compare the input voltage Vin with the reference voltage VR1 lower than the reference voltage VR2 but compares the input voltage Vin with the reference voltage VR3 higher than the reference voltage VR2.

This comparison at the second step is executed in the comparator part 20.

An operation of comparison of the comparator 100 will be described by using FIG. 2 to FIG. 5 in more detail below.

FIG. 2 to FIG. 5 are timing charts illustrating operations of the comparator 100 in the first embodiment. FIG. 2 to FIG. 5 illustrate voltage levels (H (High) or L (Low)) of the clock input terminal CK, the output terminals XD1 and XD2, the nodes BTD1 and BTD2, and the output terminals XD3 and XD0.

Furthermore, in the following, a clock to be inputted to the clock input terminal CK is referred to as a clock CK, voltages of the output terminals XD1, XD2, XD3, and XD4, are referred to as output voltages XD1, XD2, XD3, and XD4, and a voltage to be inputted to the electric power terminal AVD is referred to as an electric power source voltage AVD.

First, an operation of the comparator 100 in a case where Vin<VR1<VR2<VR3 is held among the input voltage Vin and the reference voltages VR1, VR2, and VR3 will be described by using FIG. 1 and FIG. 2.

First, the clock CK is at an L level, and thereby, the reset switches MPR0, MPR1, MPR2, and MPR3 are turned on and the switch MN0 is turned off.

Figure 2:
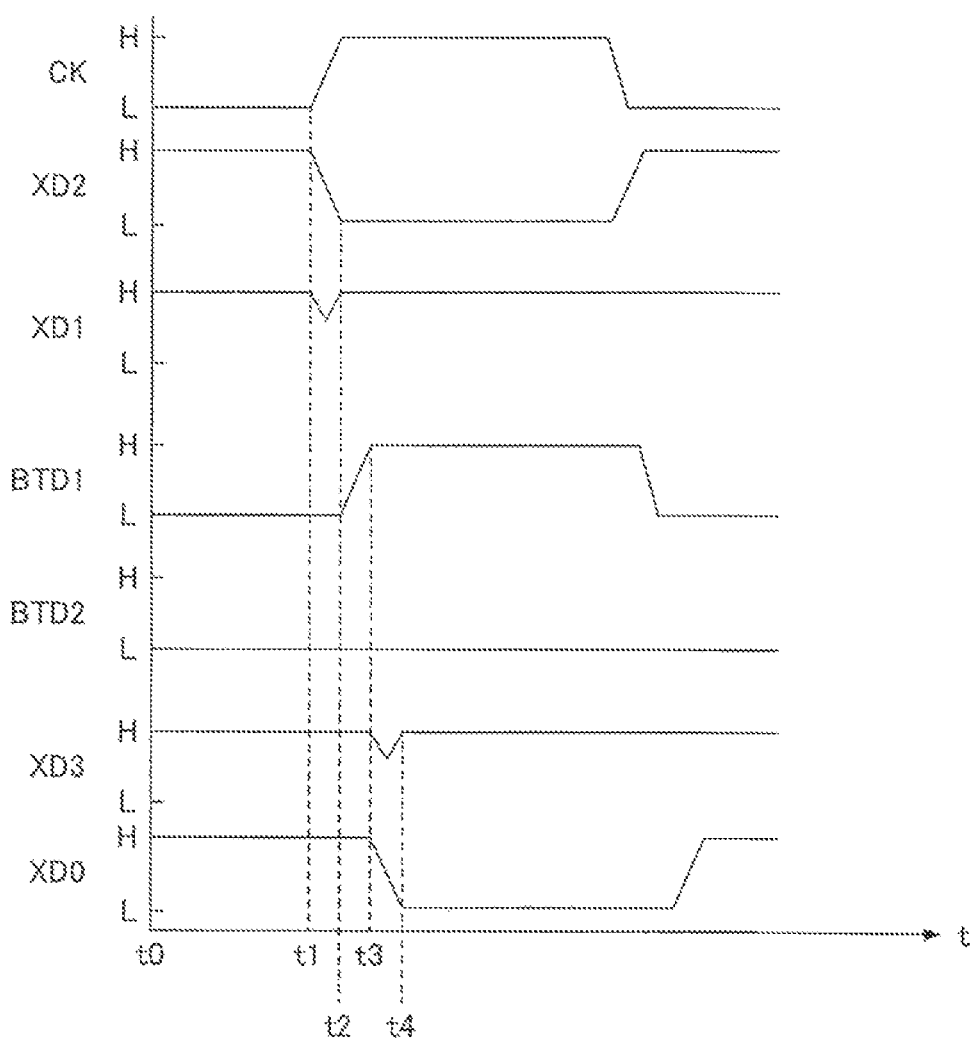
FIG. 2 is a timing chart illustrating an operation of the comparator 100 in the first embodiment.

As the reset switches MPR0, MPR1, MPR2, and MPR3 are turned on, the output voltages XD0, XD1, XD2, and XD3 are pulled up by the electric power source voltage AVD to be at an H levels (see time t0 in FIG. 2). Thereby, the output voltages XD0, XD1, XD2, and XD3 are reset and are all at H levels.

Then, as the clock CK is raised at time t1, the reset switches MPR0, MPR1, MPR2, and MPR3 are turned off and the switch MN0 is turned on.

Thereby, through-type electric currents flow on an electric current path from the electric power terminal AVD through the inverter 11 and transistor MNC2 to the switch MN0 and an electric current path from the electric power terminal AVD through the inverter 12 and the transistor MNR2 to the switch MN0.

Through-type electric currents flow on such two electric current paths, and thereby, the output voltages XD1 and XD2 are pulled down and comparison between the input voltage Vin and the reference voltage VR2 is executed.

Because the input voltage Vin is herein lower than the reference voltage VR2 (Vin<VR2), a gate-source voltage (VGS) of the transistor MNR2 is higher than a gate-source voltage (VGS) of the transistor MNC2.

For this reason, an on-resistance of the transistor MNR2 is lower than an on-resistance of the transistor MNC2, and the output voltage XD2 is lowered faster than the output voltage XD1.

Then, positive feedback of the inverters 11 and 12 is caused, and thereby, at time t2, the output voltage XD2 is charged to be at an L level and the output voltage XD1 is held at an H level. Here, slight lowering of the output voltage XD1 immediately before time t2 is an phenomenon cause by an influence of through-type electric currents flowing on both electric current paths.

Furthermore, as comparison between the input voltage Vin and the reference voltage VR2 is ended, the transistors MNI1 and MPI2 are turned off, and hence, through-type electric currents do not flow.

Herein, the output voltage XD2 is at an L level at time t2, and thereby, the node BTD1 is at an H level at time t3 so that the switches MN01 and MN11 are turned on. Thereby, comparison between the input voltage Vin and the reference voltage VR1 is executed by the transistors MNC1 and MNR1 of the differential pair circuit 23.

Furthermore, at this time, the output voltage XD1 is held at an H level, and thereby the node BDT2 is at an L level and the switches MN03 and MN13 are turned off, so that the differential pair circuit 24 is not operated and comparison between the input voltage Vin and the reference voltage VR3 is not executed.

Here, a difference between times t2 and t3 is caused by a delay time of the inverter INV1.

Because the reference voltage VR1 is herein higher than the input voltage Vin (Vin<VR1), a gate-source voltage (VGS) of the transistor MNR1 is higher than a gate-source voltage (VGS) of the transistor MNC1.

For this reason, an on-resistance of the transistor MNR1 is lower than an on-resistance of the transistor MNC1, and the output voltage XD0 is lowered faster than the output voltage XD3.

Then, positive feedback of the inverters 21 and 22 is caused, and thereby, at time t4, the output voltage XD0 is changed to be at an L level and the output voltage XD3 is held at an H level.

Here, as comparison between the input voltage Vin and the reference voltage VR1 is ended, the transistors MNI3 and MPI0 are turned off, and hence, through-type electric currents do not flow.

As described above, comparison between the input voltage Vin and the reference voltages VR1, VR2, and VR3 is ended and levels of the output voltages XD0, XD1, XD2, and XD3 are L, H, L, and H, respectively.

Next, an operation of the comparator 100 in a case where VR1<Vin<VR2<VR3 is held among the input voltage Vin and the reference voltages VR1, VR2, and VR3 will be described by using FIG. 1 and FIG. 3.

Because an operation from time t0 to time t3 is similar to a case where Vin<VR1<VR2<VR3 is held as illustrated in FIG. 2, a description thereof will be omitted.

Because the input voltage Vin is herein higher than the reference voltage VR1 (VR1<Vin), a gate-source voltage (VGS) of the transistor MNC1 is higher than a gate-source voltage (VGS) of the transistor MNR1.

For this reason, an on-resistance of the transistor MNC1 is lower than an on-resistance of the transistor MNR1, and the output voltage XD3 is lowered faster than the output voltage XD0.

Then, positive feedback of the inverters 21 and 22 is caused, and thereby, at time t4, the output voltage XD3 is changed to be at an L level and the output voltage XD0 is held at an H level.

Here, as comparison between the input voltage Vin and the reference voltage VR1 is ended, the transistors MNI0 and MPI3 are turned off, and hence, through-type electric currents do not flow.

As described above, comparison between the input voltage Vin and the reference voltages VR1, VR2, and VR3 is ended, and levels of the output voltages XD0, XD1, XD2, and XD3 are H, H, L, and L, respectively.

Next, an operation of the comparator 100 in a case where VR1<VR2<Vin<VR3 is held among the input voltage Vin and the reference voltages VR1, VR2, and VR3 will be described by using FIG. 1 and FIG. 4.

First, the clock CK is at an L level, and thereby, the reset switches MPR0, MPR1, MPR2, and MPR3 are turned on and the switch MN0 is turned off.

As the reset switches MPR0, MPR1, MPR2, and MPR3 are turned on, the output voltages XD0, XD1, XD2, and XD3 are pulled up by the electric power source voltage AVD to be at an H levels (see time t0 in FIG. 4). Thereby, the output voltages XD0, XD1, XD2, and XD3 are reset and are all at H levels.

Then, as the clock CK is raised at time t1, the reset switches MPR0, MPR1, MPR2, and MPR3 are turned off and the switch MN0 is sunned on.

Thereby, through-type electric currents flow on an electric current path from the electric power terminal AVD through the inverter 11 and transistor MNC2 to the switch MN0 and an electric current path from the electric power terminal AVD through the inverter 12 and the transistor MNR2 to the switch MN0.

Through-type electric currents flow on such two electric current paths, and thereby, the output voltages XD1 and XD2 are pulled down and comparison between the input voltage Vin and the reference voltage VR2 is executed.

Because the input voltage Vin is herein higher than the reference voltage VR1 (VR2<Vin), a gate-source voltage (VGS) of the transistor MNC2 is higher than a gate-source voltage (VGS) of the transistor MNR2.

For this reason, an on-resistance of the transistor MNC2 is lower than an on-resistance of the transistor MNR2, and the output voltage XD1 is lowered faster than the output voltage XD2.

Then, positive feedback of the inverters 11 and 12 in caused, and thereby, at time t2, the output voltage XD1 is changed to be at an L level and the output voltage XD2 is held at an H level. Here, slight lowering of the output voltage XD2 immediately before time t2 is an phenomenon cause by an influence of through-type electric currents flowing on both electric current paths.

Furthermore, as comparison between the input voltage Vin and the reference voltage VR2 is ended, the transistors MNI2 and MPI1 are turned off, and hence, through-type electric currents do not flow.

Herein, the output voltage XD1 is at an L level at time t2, and thereby, the node BTD2 is at an H level at time t3 so that the switches MN03 and MN13 are turned on. Thereby, comparison between the input voltage Vin and the reference voltage VR3 is executed by the transistors MNC3 and MNR3 of the differential pair circuit 24.

Furthermore, at this time, the output voltage XD2 is held at an H level, and thereby the node BDT1 is at an L level and the switches MN01 and MN11 are turned off, so that the differential pair circuit 23 is not operated and comparison between the input voltage Vin and the reference voltage VR1 is not executed.

Here, a difference between times t1 and t3 is caused by a delay time of the inverter INV2.

Because the reference voltage VR3 is herein higher than the input voltage Vin (Vin<VR3), a gate-source voltage (VGS) of the transistor MNR3 is higher than a gate-source voltage (VGS) of the transistor MNC3.

For this reason, an on-resistance of the transistor MNR3 is lower than an on-resistance of the transistor MNC3, and the output voltage XD3 is lowered faster than the output voltage XD0.

Then, positive feedback of the inverters 21 and 22 is caused, and thereby, at time t4, the output voltage XD3 is changed to be at an L level and the output voltage XD0 is held at an H level.

Here, as comparison between the input voltage Vin and the reference voltage VR3 is ended, the transistors MNI0 and MPI3 are turned off, and hence, through-type electric currents do not flow.

As described above, comparison between the input voltage Vin and the reference voltages VR1, VR2, and VR3 is ended and levels of the output voltages XD0, XD1, XD2, and XD3 are H, L, H, and L, respectively.

Next, an operation of the comparator 100 in a case where VR1<VR2<VR3<Vin is held among the input voltage Vin and the reference voltages VR1, VR2, and VR3 will be described by using FIG. 1 and FIG. 5.

Because an operation from time t0 to time t3 is similar to a case where VR1<VR2<Vin<VR3 is held as illustrated in FIG. 4, a description thereof will be omitted.

Because the input voltage Vin is herein higher than the reference voltage VR3 (VR3<Vin), a gate-source voltage (VGS) of the transistor MNC3 is higher than a gate-source voltage (VGS) of the transistor MNR3.

For this reason, an on-resistance of the transistor MNC3 is lower than an on-resistance of the transistor MNR3, and the output voltage XD0 is lowered faster than the output voltage XD3.

Then, positive feedback of the inverters 21 and 22 is caused, and thereby, at time t4, the output voltage XD0 is changed to be at an L level and the output voltage XD3 is held at an H level.

Here, as comparison between the input voltage Vin and the reference voltage VR3 is ended, the transistors MNI3 and MPI0 are turned off, and hence, through-type electric currents do not flow.

As described above, comparison between the input voltage Vin and the reference voltages VR1, VR2, and VR3 is ended and levels of the output voltages XD0, XD1, XD2, and XD3 are L, L, H, and H respectively.

Next, a configuration for connecting a NAND-type latch circuit and an encoding part to the output terminals XD0, XD1, XD2, and XD3 of the comparator 100 will be described by using FIG. 6.

FIG. 6 is a diagram illustrating a configuration of a comparator circuit 1000 that includes the comparator 100 in the first embodiment.

The comparator circuit 1000 includes a comparator circuit part 500 and an encoding part 50.

The comparator circuit part 500 includes the comparator 100 and NAND-type latch circuits 30 and 40.

Because the output voltages XD0, XD1, XD2, and XD3 of the comparator 100 are outputs at an H level at a time when the clock CK is at an L level, the output terminals XD1 and XD2 and the output terminals XD0 and XD3 are at states of "H" and "H", respectively, and outputs of the latch circuits 30 and 40 hold respective previous output states. Elements of this part are referred to as a comparator part and separated from an encoding part for encoding such outputs into 2 bit digital codes.

Herein, in FIG. 6, the comparator 100 illustrated in FIG. 1 is simplified to illustrate only the input terminal Vin, the reference terminals VR1, VR2, and VR3, the clock input terminal CK, and the output terminals XD0, XD1, XD2, and XD3.

In the comparator circuit part 500, the NAND-type latch circuits 30 and 40 are connected to the output terminals XD1 and XD2 and the output terminals XD0 and XD3 of the comparator 100, respectively, as illustrated in FIG. 6.

Two input terminals of the NAND-type latch circuit 30 are respectively connected to the output terminals XD1 and XD2 of the comparator 100. Furthermore, the NAND-type latch circuit 30 has a pair of output terminals DO1 and DO2. The NAND-type latch circuit 30 is one example of a first NAND-type latch circuit.

Two input terminals of the NAND-type latch circuit 40 are respectively connected to the output terminals XD0 and XD3 of the comparator 100. Furthermore, the NAND-type latch circuit 40 has a pair of output terminals DO0 and DO3. The NAND-type latch circuit 40 is one example of a second NAND-type latch circuit.

During a reset term where the clock CL is at an L level, the output voltages XD0, XD1, XD2, and XD3 of the comparator 100 are all reset at H levels. This is executed in each period of time of the clock CK.

The reason why the NAND-type latch circuits 30 and 40 are used at an output side of the comparator 100 is that a result of comparison at a state before being reset is held during a reset period of time.

Furthermore, the encoding part 50 includes input terminals 50A, 50B, 50C, and 50D, NAND circuits 51, 52, and 53, and output terminals D0 and D1.

The input terminals 50A, 50B, 50C, and 50D are connected to the output terminals DO0, DO1, DO2, and DO3, respectively.

One input terminal of the NAND circuit 51 (at an upper side in the figure) is connected to the input terminal 50C and the other input terminal (at a lower side in the figure) is connected to the input terminal 50D. One input terminal of the NAND circuit 52 (at an upper side in the figure) is connected to the input terminal 50A and the other input terminal (at a lower side in the figure) is connected to the input terminal 50B. Output terminals of the NAND circuits 51 and 52 are respectively connected to two input terminals of the NAND circuit 53.

The output terminal D1 it connected to the input terminal 50B and the output terminal D0 is connected to an output terminal of the NAND circuit 53.

The encoding part 50 is provided to encode four outputs that are outputted from the output terminal DO0, DO1, DO2, and DO3 of the NAND-type latch circuits 30 and 40 into binary ones.

Such output levels of the output terminals XD0, XD1, XD2, and XD3 of the comparator 100, the output terminals DO1 and DO2 of the NAND-type latch circuit 30, a pair of the output terminals DO0 and DO3 of the NAND-type latch circuit 40, and the output terminals D0 and D1 are provided as illustrated in FIG. 7.

FIG. 7 is a diagram illustrating output levels obtained in the comparator 100 in the embodiment, the NAND-type latch circuits 30 and 40, and the encoding part 50. In FIG. 7, ↑(H) for the clock CK indicates raising to an H level.

Herein, output levels of the output terminals XD0, XD1, XD2, and XD3, and the output terminals DO0, DO1, DO2, and DO3 are indicated as nonterminal node logics. Furthermore, output levels of the output terminals D0 and D1 are indicated as output logics.

As illustrated in FIG. 7, during a reset period of time where the clock CK is at an L level, output levels of the output terminals XD0, XD1, XD2, and XD3 are all at H levels but output levels of the output terminals DO0, DO1, DO2, and DO3 hold a result of comparison.

Furthermore, as illustrated in FIG. 7, it is possible for output levels of the output terminals D0 and D1 to represent a result of comparison between the input voltage Vin and the reference voltages VR1, VR2, and VR3 by 2-bit digital code. Output levels of the output terminals D0 and D1 are obtained by binary encoding based on output levels of the output terminals DO0, DO1, DO2, and DO3.

As described above, the comparator 100 in the first embodiment compares the input voltage Vin with the reference voltage VR2 at a first step, and in a case where the input voltage Vin is lower than the reference voltage VR2, compares the input voltage Vin with the reference voltage VR1 lower than the reference voltage VR2 at a second step. In this case, comparison between the input voltage Vin and the reference voltage VR3 is not executed.

Furthermore, the comparator 100 in the first embodiment compares the input voltage Vin with the reference voltage VR2 at a first step, and in a case where the input voltage Vin is higher than the reference voltage VR2, compares the input voltage Vin with the reference voltage VR3 higher than the reference voltage VR2 at a second step. In this case, comparison between the input voltage Vin and the reference voltage VR1 is not executed.

Therefore, it is possible to reduce a through-type electric current, and thereby, it is possible to attain reduction of electric power consumption.

In other words, comparison with a median value (VR2) among three reference voltages (VR1, VR2, and VR3) is executed at a first step and comparison with only one of remaining two reference voltages (VR1 and VR3) is executed at a second step, depending on a result or comparison as obtained at the first step, so that the number of transistors to be driven and reduction of electric power consumption is attained.

Furthermore, in a case where three comparators are used to compare the input voltage Vin with the three reference voltages (VR1, VR2, and VR3), three NAND circuits are used and it is sufficient to connect the two NAND-type latch circuits 30 and 40 to the comparator 100 in the first embodiment.

For this reason, it is possible to reduce the number of NAND-type latch circuits in the first embodiment, so that it is also possible to attain reduction of electric power consumption.

Herein, a comparator for comparison will be described by using FIG. 8 to FIG. 11.

FIG. 8 is a diagram illustrating a compactor circuit 9 for comparison.

The comparator circuit 90 for comparison includes a comparator circuit part 70 and an encoding part 80.

The comparator circuit part 70 includes three comparators 71, 72, and 73 and three NAND-type latch circuits 74, 75, and 76. Furthermore, the encoding part 80 includes NAND circuits 81, 82, and 83.

Reference voltages VR1, VR2, and VR3 are inputted to the comparators 71, 72, and 73, respectively, and an operation of comparison is executed by raising of a clock CK to output a differential output representing a result of comparison with an input voltage Vin. Additionally, the reference voltages VR1, VR2, and VR3 have a relationship of VR1<VR2<VR3, similarly to the first embodiment.

As illustrated in FIG. 8, pairs of output terminals of the comparators 71, 72, and 73 to output differential outputs are connected to the NAND-type circuits 74, 75, and 76, respectively.

There is no output destination for one output terminal of the NAND-type latch circuit 74 (at an upper side of the figure) and the other output terminal (in a lower side of the figure) is connected to the other input terminal of the NAND circuit 81 of the encoding part 80 (at a lower side of the figure).

One output terminal of the NAND-type latch circuit 75 (at an upper side of the figure) is connected to one input terminal of the NAND circuit 81 of the encoding part 80 (at an upper side of the figure) and the other output terminal (at a lower side of the figure) is connected to an output terminal D1 of the encoding part 80 and the other input terminal of the NAND circuit 82 (at a lower side of the figure).

There is no output destination for one output terminal of the NAND-type latch circuit 76 (at an upper side of the figure) and the other output terminal (at a lower side of the figure) is connected to one input terminal of the NAND circuit 82 of the encoding part 80 (at an upper side of the figure).

An output terminal of the NAND circuit 81 of the encoding part 80 and an output terminal of the NAND circuit 82 are input terminals of the NAND circuit 83, respectively, and an output terminal of the NAND circuit 83 is connected to an output terminal D0 of the encoding part 80.

In the comparator circuit part 70 of such a comparator 90 for comparison, the comparators 71, 72, and 73 compare the input terminal Vin with the reference voltages VR1, VR2, and VR3, respectively. The comparators 71, 72, and 73 input differential outputs representing results of comparison to the NAND-type latch circuits 74, 75, and 76, respectively.

Then, the encoding part 80 outputs 2-bit outputs D0 and D1 representing results of comparison between the input voltage Vin and the reference voltages VR1, VR2, and VR3 from output terminals D0 and D1, respectively, based on outputs of the NAND-type latch circuits 74, 75, and 76.

Herein, a circuit configuration of the comparator 71 included in the comparator circuit part 70 of the comparator circuit 90 for comparison will be described by using FIG. 9 and FIG. 10. The comparator 71 will be described herein, because the comparators 71, 72, and 73 have similar configurations.

FIG. 9 is a diagram illustrating a circuit configuration of the comparator 71. FIG. 10 is a diagram illustrating the comparator 71 by symbols.

The comparator 71 includes a switch MN0, inverters 71A and 71B, transistors QM1 and QM2, reset switches QRP0 and QRP1, an input terminal Vin+, a reference terminal Vin−, an electric power terminal AVD, and output terminals OP and OM.

The inverters 71A and 71B have transistors QPI1 and QNI1 and transistors QPI2 and QNI2, respectively.

The inverter 71A, the transistor QM1, and the switch MN0 compose an electric current path between an electric power terminal AVD and a ground terminal GND. Furthermore, the inverter 71B, the transistor QM2, and the switch MN0 compose an electric current path between the electric power terminal AVD and the ground terminal GND.

The reset switch QRP0 is such that a source is connected to the electric power terminal AVD, a gate is connected to a clock input terminal CK, and a drain is connected to an output terminal of the inverter 71A, an input terminal of the inverter 71B, and the output terminal OP.

The reset switch QRP1 is such that a source is connected to the electric power terminal AVD, a gate is connected to the clock input terminal CK, and a drain is connected to an input terminal of the inverter 71A, an output terminal of the inverter 71B, and an output terminal OM.

As a clock CK is at an L level in such a comparator 71, the reset switches QRP0 and QRP1 are turned on and outputs of the output terminals OP and OM are reset at H levels. As this time, the switch MN0 is turned off.

Furthermore, the clock CK is raised, both the reset switches QRP0 and QRP1 are turned off, and the switch MN0 is turned on, so that comparison between an input voltage Vin+ and a reference voltage Vin− is executed to output differential outputs representing a result of comparison from the output terminals OP and OM.

As comparison between the input voltage Vin+ and the reference voltage Vin− is executed, through-type electric currents flow on two electric current paths. Here, although the reference voltage Vin− is illustrated herein, one of VR1, VR2, and VR3 (see FIG. 8) is inputted as the reference voltage.

It is possible to denote such a comparator 71 by a symbol as illustrated in FIG. 10. The comparator 71 illustrated in FIG. 10 includes an input terminal Vin+, a reference terminal Vin−, a clock input terminal CK, and output terminals OP and OM. Such a comparator 71 illustrated in FIG. 10 is identical to symbols for representing the comparators 71, 72, and 73 illustrated in FIG. 8.

The comparator 71 is a so-called NMOS (N-channel Metal Oxide Semiconductor) differential dynamic comparator. This is also similar for the comparators 72 and 73.

Next, magnitude relationships between the input terminal Vin and the reference voltages VR1, VR2, and VR3 and relationships of the outputs D0 and D1 of the encoding part 80 therewith, in the comparator circuit 90 for comparison (see FIG. 8) will be described by using FIG. 11.

FIG. 11 is a diagram illustrating outputs of the comparator circuit 90 for comparison.

In a case of Vin<VR1<VR2<VR3, outputs D0 and D1 of the encoding part 80 are L and L, respectively, due to an operation of comparison executed by raising the clock CK. Furthermore, in a case of VR1<Vin<VR2<VR3, outputs D0 and D1 of the encoding part 80 are H and L, respectively, due to an operation of comparison executed by raising the clock CK.

Furthermore, in a case of VR1<VR2<Vin<VR3, outputs D0 and D1 of the encoding part 80 are L and H, respectively, due to an operation of comparison executed by raising the clock GK. Furthermore, in a case of VR1<VR2<VR3<Vin, outputs D0 and D1 of the encoding part 50 are H and H, respectively, due to an operation of comparison executed by raising the clock CK.

Thus, 2-bit outputs D0 and D1 of the encoding part 80 represent a relationship with magnitude relationships between the input terminal Vin and the reference voltages VR1, VR2, and VR3.

As described above, according to the comparator circuit 90 for comparison, it is possible to obtain 2-bit outputs representing a result of comparison between the input voltage Vin and the three reference voltages VR1, VR2, and VR3, similarly to the comparator circuit 1000 (see FIG. 6) in the first embodiment.

However, as illustrated in FIG. 8, the comparator circuit 90 for comparison has the three comparators 71, 72, and 73 to compare between the input voltage Vin and the three reference voltages VR1, VR2, and VR3.

Because each of the three comparators 71, 72, and 73 has a circuit configuration illustrated in FIG. 9, two electric current paths are used to compare between the input voltage Vin and the reference voltages VR1, VR2, and VR3, respectively, so that six electric current paths are used totally.

On the other hand, in the comparator 100 in the first embodiment, at a first step, through-type electric currents flow on two electric current paths that include the inverters 11 and 12 respectively, and at a second step, through-type electric currents flow on two electric current paths that include the inverters 21 and 22, respectively.

For this reason, according to the first embodiment, it is possible to reduce an amount of a through-electric current, and as a result, to provide the comparator 100 with a reduced electric power consumption.

Herein, if each of the comparator parts 10 and 20 included in the comparator 100 in the first embodiment is regarded as an NMOS differential dynamic comparator, it is sufficient for an electric current for an operation of a comparator in the first embodiment to be an electric current for an operation of two NMOS differential dynamic comparators.

This is achieved by composing the comparator part 20 in such a manner that comparison between the input voltage Vin and the reference voltage VR1 or comparison between the input voltage exclusively.

The comparator part 70 for comparison executes comparison between the input voltage Vin and the reference voltage VR3 even in a case of Vin<VR2 as the input voltage Vin and the three reference voltages VR1, VR2, and VR3 (VR1<VR2<VR3) are compared. Furthermore, even in a case of VR2<Vin, comparison between the input voltage Vin and the reference voltage VR1 is executed.

For this reason, the comparator 70 for comparison always operates the three comparators 71, 72, and 73 so that this leads to an increase in electric power consumption. An operation of one of the three comparators 71, 72, and 73 does not relate to a result of comparison, and the comparator part 70 for comparison includes a redundant element on operation.

On the other hand, because it is sufficient to operate only the two comparator parts 10 and 20 for an operation of comparison between the input voltage Vin and the three reference voltages VR1, VR2, and VR3 in the comparator 100 in the first embodiment, it is possible to reduce electric power consumption as compared with the comparator part 70 for comparison.

Furthermore, the comparator circuit part 70 for comparison has the three NAND-type latch circuits 74, 75, and 76.

On the other hand, the two NAND-type latch circuits 30 and 40 are sufficient for the comparator circuit part 500 in the first embodiment (see FIG. 6). This is because it is possible for the comparator 100 to execute comparison between the input voltages Vin and the three reference voltages VR1, VR2, and VR3 at the two comparator parts 10 and 20 and output a result of comparison to the output terminals XD0, XD1, XD2, and XD3.

The output terminals XD0, XD1, XD2, and XD3 output an output representing a result of comparison at a first stage (a result of comparison between Vin and VR2) in a differential form at the output terminals XD1 and XD2. Furthermore, an output representing a result of comparison at a second step (a result of comparison between Vin and either one of VR1 or VR3) is outputted in a differential form at the output terminals XD0 and XD3.

Therefore, the comparator circuit part 500 in the first embodiment reduces the number of NAND-type latch circuits as compared with the comparator circuit part 70 for comparison, and thereby, it is possible to reduce electric power consumption.

Herein, the number of transistors included in the comparator circuit part 500 in the first embodiment and the comparator circuit part 70 for comparison are compared on a condition that eight transistors are included in each of the NAND-type latch circuits 30, 40, 74, 75, and 76.

The number of transistors included in the comparator circuit part 500 in the first embodiment is 43. This is a number obtained on a condition that two transistors are included in each of the inverters INV1 and INV2 and the comparator 100 (see FIG. 1) includes 27 transistors.

On the other hand, the comparator circuit part 70 for comparison includes 51 transistors because each of the comparators 71, 72, and 73 includes 9 transistors (see FIG. 9).

Therefore, it is possible for the comparator circuit part 500 in the first embodiment to reduce the number of transistors by about 15%, as compared with the comparator circuit part 70 for comparison.

For this reason, it is possible for the comparator circuit part 500 in the first embodiment to provide cost reduction thereof, as compared with the comparator circuit part 70 for comparison, because it is possible to reduce electric power consumption and it is possible to reduce a surface area of an integrated circuit.

Here, an embodiment has been described above, wherein the comparator 100 in the first embodiment includes the comparator parts 10 and 20 as so-called NMOS differential dynamic comparators. However, PMOS (p-channel Metal Oxide Semiconductor) differential dynamic comparators may be used as the comparator parts 10 and 20, as illustrated in FIG. 12.

FIG. 12 illustrates a diagram illustrating a circuit configuration of a comparator 100A in an variation example of the first embodiment.

The comparator 100A includes an input terminal Vin, reference terminals VR1, VR2, and VR3, output terminals XD0, XD1, XD2, and XD3, a clock input terminal CK, and an electric power terminal AVD.

The comparator 100A further includes reset switches MN0, MNR1, MNR2, and MNR3, and a switch MP0.

The comparator 100A further includes a pair of inverters 11A and 12A connected to provide positive feedback thereto, a differential pair circuit 13A, and inverters INV1 and INV2. The inverter 11A has transistors MPI1 and MNI1 and the inverter 12A has transistors MPI2 and MNI2. Furthermore, the differential pair circuit 13A includes transistors MPC2 and MPR2.

Herein, the inverters 11A and 12A, the differential pair circuit 13A, the inverters INV1 and INV2, the switch MP0, and the reset switches MNR1 and MNR2 compose a comparator part 10A. The comparator part 10A is one example of a first comparison unit.

The comparator 100A further includes a pair of inverters 21A and 22A connected to provide positive feedback thereto, switches MP01, MP11, MP03, and MP13, and differential pair circuits 23A and 24A.

The inverter 21A has transistors MPI0 and MNI0. The inverter 22A has transistors MPI0 and MNI3. The differential pair circuit 23A has transistors MPR1 and MPC1. The differential pair circuit 24A has transistors MPR3 and MPC3.

Herein, the inverters 21A and 22A, the switches MP01, MP11, MP03, and MP13, the differential pair circuits 23A and 24, and the reset switches MNR0 and MNR3 compose a comparator part 20A. The comparator part 20A is one example of a second comparison unit.

The comparator 100A illustrated in FIG. 12 is such that channel types of the reset switches MNR0, MNR1, MNR2, and MNR3, the switch MP0, the differential pair circuit 13A, the switches MP01, MP11, MP03, and MP13, and the differential pair circuits 23A and 24A in the comparator 100 illustrated in FIG. 1 are changed.

That is, the reset switches MNR0, MNR1, MNR2, and MNR3 are such that p-channel types thereof in the comparator 100 illustrated in FIG. 1 are changed to N-channel types.

Furthermore, the switch MP0, the differential pair circuit 13A, the switches MP01, MP11, MP03, and MP13, and the differential pair circuits 23A and 24 are such that N-channel-types thereof in the comparator 100 illustrated in FIG. 1 are changed to p-channel types.

Thus, channel types of the transistors are inverted, so that a connection relationship between respective components in the comparator 100A illustrated in FIG. 12 in a relationship wherein a connection relationship between respective corresponding components in the comparator 100 illustrated in FIG. 1 are inverted between the electric power terminal AVD and GND.

Furthermore, channel types of the transistors are inverted, so that reset operations of the reset switches MNR0, MNR1, MNR2, and MNR3 are executed when a clock CK is at an H level, and an operation of comparison is started when the clock CK falls to an L level.

Herein, details of an operation of the comparator 100A are similar to those of an operation of the comparator 100 illustrated in FIG. 1 and hence will be omitted, but nonterminal node logics corresponding to those in FIG. 7 are illustrated in FIG. 13.

FIG. 10 is a diagram illustrating nonterminal node logics XD0, XD1, XD2, and XD3 of the comparator 100A in the variation example of the first embodiment.

As the clock CK is at an H level as illustrated in FIG. 13 to execute a reset operation, output levels of the output terminals XD0, XD1, XD2, and XD3 are all at L levels.

Furthermore, a result of execution of an operation or comparison is a result similar to that of the comparator 100 illustrated in FIG. 7.

Therefore, it is also possible to reduce through-type electric currents in the comparator 100A illustrated in FIG. 12 similarly to the comparator 100 illustrated in FIG. 1, and thereby, it is possible to attain reduction of electric power consumption.

Second Embodiment

FIG. 14 is a diagram illustrating a comparator circuit 2000 in a second embodiment.

The comparator circuit 2000 in the second embodiment is such that an EOC (End of Conversion) generation part 210 is added to the comparator circuit 1000 (see FIG. 6) in the first embodiment. Because the other configurations are similar to those of the comparator circuit 1000 in the first embodiment, an identical reference numeral is attached to each similar component and a description thereof will be omitted.

The EOC generation part 210 generates an EOC signal indicating an end of an operation of comparison in the comparator 100.

The EOC generation part 210 includes a NAND circuit 211 and an output terminal 212. Two input terminals of the NAND circuit 211 are respectively connected to the output terminals XD0 and XD3 of the comparator 100.

In the comparator 100, outputs of the output terminals XD1 and XD2 have already been determined at a stage for determining outputs of the output terminals XD0 and XD3.

This is because the output terminals XD1 and XD2 output a result of an operation of comparison at a first step in the comparator part 10 (an operation of comparison between an input voltage Vin and a comparison voltage VR2) and the output terminals XD0 and XD3 output a result of an operation of comparison at a second step in the comparator part 20 (an operation of comparison between the input voltage Vin and a comparison voltage VR1 or VR3).

For this reason, it is sufficient to use only outputs of the output terminals XD0 and XD3 in order to generate an EOC signal indicating an end of an operation of comparison at the EOC generation cart 210.

An EOC signal outputted from the output terminal 212 of the EOC generation part 210 is at an H level. This is because the comparator 100 is reset so that both output levels of the output terminals XD0 and XD3 at H level states are changed when an operation of comparison is ended, in such a manner that either one of the output levels of the output terminals XD0 and XD3 is at an L level (see FIG. 7).

Therefore, according to the second embodiment, it is possible to obtain an EOC signal by merely adding the EOC generation part 210 including one NAND circuit 211 thereto. Because the EOC generation part 210 is composed of one NAND circuit 211, it is possible to generate an EOC signal by merely using four transistors so that it is possible to attain reduction of electric power consumption.

Herein, a comparator circuit 90A for comparison will be described by using FIG. 15.

FIG. 15 is a diagram illustrating the comparator circuit 90A for comparison. The comparator circuit 90A for comparison is such that an EOC generation part 91 is added to the comparator circuit 90 for comparison illustrated in FIG. 8.

The EOC generation part 91 include three NAND circuits 92, 93, and 94, an AND circuit 95, and an output terminal 96.

Two input terminals of the NAND circuit 92 are connected to the two output terminals of the comparator 71, respectively. An output terminal of the NAND circuit 92 is connected to one of three input terminals of the AND circuit 95.

Two input terminals of the NAND circuit 93 are connected to the two output terminals of the comparator 72, respectively. An output terminal of the NAND circuit 93 is connected to one of three input terminals of the AND circuit 95.

Two input terminals of the NAND circuit 94 are connected to the two output terminals of the comparator 73, respectively. An output terminal of the NAND circuit 94 is connected to one of three input terminals of the AND circuit 95.

Three input terminals of the AND circuit 95 are respectively connected to output terminals of the NAND circuits 92, 93, and 94 and an output terminal thereof is connected to the output terminal 96.

The output terminal 96 generates an EOC signal.

Because operations of comparison in the comparators 71, 72, and 73 of the comparator circuit part 70 are executed in parallel in the comparator circuit 91A for comparison, a pair of outputs of each of the comparators 71, 72, and 73 is not determined until operations of comparison are all determined.

For this reason, the EOC generation part 91 including the three NAND circuits 92, 93, and 94 and the AND circuit 95, as illustrated in FIG. 15, is added to the comparator circuit 90 for comparison illustrated in FIG. 8 in order to obtain an EOC signal therein.

The EOC generation part 91 includes the three NAND circuits 92, 93, and 94 and the three-input AND circuit 95.

The three NAND circuits 92, 93, and 94 are circuits for detecting completion of operations of comparison in the comparators 71, 72, and 73, respectively. Furthermore, it is not possible to know which comparator (71, 72, or 73) completes a conversion finally depending on an input voltage because a period of time for completion of an operation of comparison is longer when an electric potential difference of a differential pair of a dynamic comparator is smaller, and hence, the three-input AND circuit 95 detects outputs of the NAND circuits 92, 93 and 94 being all at H levels and outputs an EOC signal at an H level.

Herein, calculation is executed in such a manner that each of the NAND circuits 211, 92, 93, and 94 includes four transistors and the three-input AND circuit 95 includes six transistors.

As a result, the number of transistors in the EOC generation part 210 of the comparator circuit 2000 illustrated in FIG. 14 is fourteen less than that of the EOC generation part 91 of the comparator circuit 90A illustrated in FIG. 15.

Therefore, according to the second embodiment, it is possible to obtain further reduction of electric power consumption in a case where an EOC signal is generated.

Third Embodiment

A comparator 300 in a third embodiment is such that a DTCK (Delay Time Clock) terminal is added to the comparator 100 in the first embodiment (see FIG. 1). Because the other configurations are similar to those of the comparator 100 in the first embodiment, an identical reference numeral is attached to a similar component and a description thereof will be omitted.

FIG. 16 is a diagram illustrating the comparator 300 in the third embodiment.

The comparator 300 in the third embodiment is such that nor operation circuits NOR1 and NOR2 are used instead of the inverters INV1 and INV2 of the comparator 100 in the first embodiment (see FIG. 1), respectively, and a DTCK terminal is added thereto.

One input terminal of the nor operation circuit NOR1 (at an upper side in the figure) is connected to the DTCK terminal and the other input connected to an input terminal or the inverter 11, an output terminal of the inverter 12, and the output terminal XD2. An output terminal of the nor operation circuit NOR1 is connected to gates of the switches MN01 and MN11 (node BTD1). The nor operation circuit NOR1 is one example of a first NOR circuit.

One input terminal of the nor operation circuit NOR2 (at an upper side in the figure) is connected to an output terminal of the inverter 11, an input terminal of the inverter 12, and the output terminal XD1, and the other input terminal (at a lower side in the figure) is connected to the DTCK terminal. An output terminal of the nor operation circuit NOR2 is connected to gates of the switches MN03 and MN13 (node BTD2). The nor operation circuit NOR2 is one example of a second NOR circuit.

When an operation of comparison at a second step is started by the comparator part 20 after an operation of comparison at a first step is ended by the comparator part 10, raising of a clock is inputted to the DTCK terminal.

As a result, an output of the corresponding nor operation circuit NOR1 or NOR2 is at an H level and the corresponding node BTD1 or BTD2 is at an H level, so that an operation of comparison at a second step in the comparator 20 (an operation of comparison between the input voltage Vin and the comparison voltage VR1 or VR3) is started.

That is, falling of a clock is inputted to the DTCK terminal in the third embodiment, and thereby, it is possible for the comparator part 30 to start an operation of comparison at a second step.

For example, a voltage fluctuation caused by noise may be caused (ringing may be caused) on an electric power source electric potential inputted from an electric power terminal AVD or a GND electric potential, due to a resistance component R, a capacitance component C, an inductance component L, or the like, of a wiring of a package member for mounting a comparator circuit including the comparator 300 thereon or the like. Furthermore, a kick back voltage may be caused by an operation of comparison in the comparator 100 to change the input voltage Vin.

Because it is possible to use the comparator 300 in the third embodiment for, for example, SAR (Successive AppRoximation), ADC (Analog to Digital Converter), a pipeline ADC, or a Flash-type ADC, or the like, it is possible to provide, for example, a package circuit of a comparator included in these ADCs or the like, for the aforementioned package component.

There is a possibility of causing such a voltage fluctuation in the comparator 300 in the third embodiment, and it is effective in a case where a comparatively long period of time is taken for convergence of a voltage fluctuation after an operation for comparison at a first step is ended or in a case where it is desired that a time for starting an operation at a second step be delayed.

For this reason, it is sufficient for a clock DTCK inputted to the DTCK terminal to be a clock delayed by a predetermined delay time with respect to the clock input terminal CK.

It is sufficient for this delay time to be a time for delaying falling of a clock DTCK with respect to raising of a clock CK, by a period of time necessary to converge a change in the input voltage Vin as caused by a kick back voltage involved with an operation of comparison in the comparator 100. Here, this delay time is a time less than one cycle of a clock CK, and it is sufficient for generation of the clock DTCK to be executed by delaying the clock CK by using, for example, a digital delay line or the like.

Herein, an operation of the comparator 300 in the third embodiment will be described by using FIG. 17. An operation illustrated in FIG. 17 is an operation corresponding to the operation of the comparator 100 in the first embodiment as illustrated in FIG. 2 (an operation in a case where Vin<VR1<VR2<VR3 is held).

FIG. 17 is a timing chart illustrating an operation of the comparator 300 in the third embodiment. FIG. 17 illustrates voltage levels (H (High) or L (Low)) of the clock input terminal CK, the output terminal XD1 and XD2, the DTCK terminal, the nodes BTD1 and BTD2, the output terminal XD3 and XD0.

Furthermore, in the following, a clock to be inputted to the clock input terminal CK is referred to as a clock CK, voltages of the output terminals XD1, XD2, XD3, and XD4 are referred to as output voltages XD1, XD2, XD3, and XD4, and a voltage to be inputted to the electric power terminal AVD is referred to as an electric power source voltage AVD. Furthermore, a clock to be inputted to the DTCK terminal is referred to as a clock DTCK.

Here, times t1, t2, t3, and t4 that will be described below are different from the times t1, t2, t3, and t4 illustrated in FIG. 2 to FIG. 5.

First, the clock CK is at an L level, so that the reset switches MPR0, MPR1, MPR2, and MPR3 are turned on and the switch MN0 is turned off.

As the reset switches MPR0, MPR1, MPR2, and MPR3 are turned on, the output voltages XD0, XD1, XD2, and XD3 are pulled up by the electric power source voltage AVD to be at H levels (see time t0 in FIG. 17). Thereby, the output voltages XD0, XD1, XD2, and XD3 are reset to be all at H levels.

Then, as the clock CK is raised at time t1, the reset switches MPR0, MPR1, MPR2, and MPR3 are tuned off and the switch MN0 is turned on.

Thereby, through-type electric currents flow on an electric current path from the electric power terminal AVD through the inverter 11 and the transistor MNC2 to the switch MN0 and an electric current path from the electric power terminal AVD to the transistor MNR2 to the switch MN0.

Through-type electric currents flow on the two electric current paths, and thereby, the output voltages XD1 and XD2 are pulled down to execute comparison between the input voltage Vin and the reference voltage VR2.

Herein, a gate source voltage (VGS) of the transistor MNR2 is higher than a gate-source voltage (VGS) of the transistor MNC2, because the input voltage Vin is lower than the reference voltage VR2 (Vin<VR2).

For this reason, an on-resistance of the transistor MNR2 is lower than an on-resistance of the transistor MNC2, so that the output voltage XD2 is lowered faster than the output voltage XD1.

Then, positive feedback of the inverters 11 and 12 is caused so that the output voltage XD2 is changed to be at an L level at time t2 and the output voltage XD1 is held at an H level. Here, slight lowering of the output voltage XD1 immediately before time t2 is an phenomenon cause by an influence of through-type electric currents flowing on both electric current paths.

Furthermore, as comparison between the input voltage Vin and the reference voltage VR2 is ended, the transistors MNI1 and MPI2 are turned off, and hence, through-type electric currents do not flow. Thereby, an operation of comparison at a first step is ended.

Herein, the output voltage XD2 is at an L level at time t2 so that a signal at an L level is inputted to the other input terminal of the nor operation circuit NOR1 (at a lower side in the figure), but the clock DTCK is at an H level at time t2, and hence, an output of the nor operation circuit NOR1 is at an L level.

Then, as the clock DTCK starts to fall at time t3, a level of the code BTD1 starts to rise at time t4 and the node BTD1 is at an H level at time t5 so that the switches MN01 and MN11 are turned on. Thereby, comparison between the input voltage Vin and the reference voltage VR1 is executed by the transistors MNC1 and MNR1 of the differential pair circuit 23.

Furthermore, at this time, the output voltage XD1 is held at an H level so that the node BDT2 is at an L level and the switches MN03 and MN13 are turned off, and hence, the differential pair circuit 24 is not operated so that comparison between the input voltage Vin and the reference voltage VR3 is not executed.

Herein, the reference voltage VR1 is higher than the input voltage Vin (Vin<VR1), and hence, a gate-source voltage (VGS) of the transistor MNR1 is higher than a gate-source voltage (VGS) of the transistor MNC1.

For this reason, an on-resistance of the transistor MNR1 is lower than an on-resistance of the transistor MNC1 so that the output voltage XD0 is lowered faster than the output voltage XD3.

Then, positive feedback of the inverters 21 and 22 is caused so that the output voltage XD0 is changed to be at an L level at time t6 and the output voltage XD3 is held at an H level.

Here, as comparison between the input voltage Vin and the reference voltage VR1 is ended, the transistors MNI3 and MPI0 are turned off so that through-type electric currents do not flow.

As described above, comparison between the input voltage Vin and the reference voltages VR1, VR2, and VR3 is ended, so that levels of the output voltages XD0, XD1, XD2, and XD3 are L, H, L, and H, respectively.

Here, FIG. 17 illustrates an operation corresponding to the operation of the comparator 100 in the first embodiment as illustrated in FIG. 2 (an operation in a case where Vin<VR1<VR2<VR3 is held) as one example.

However, an operation of comparison at a second step is also started by falling of the clock DTCK after an operation of comparison at a first step is ended, similarly for an operation in a case where VR1<Vin<VR2<VR3 is held (see FIG. 3), an operation in a case where VR1<VR2<Vin<VR3 is held (see FIG. 4), or an operation in a case where VR1<VR2<VR3<Vin is held (see FIG. 5).

Therefore, according to the comparator 300 in the third embodiment, it is possible to reduce through-type electric currents, and thereby, it is possible to attain reduction of electric power consumption.

There is a possibility of causing a voltage fluctuation as described above for the comparator 300 in the third embodiment, and it is effective in a case where a comparatively long period of time is taken for convergence of a voltage fluctuation after an operation of comparison at a first step is ended, or in a case where it is desired that a time for starting an operation at a second step be delayed.

Here, although the terms a comparator (100, 200), a comparator circuit part (500), and a comparator circuit (1000, 2000) have been used in the aforementioned embodiments 1 to 3, these terms are used for making distinction for the purpose of illustration. Therefore, it is possible to treat all of a comparator (100, 300), a comparator circuit part (500), and a comparator circuit (1000, 2000) as comparators.

According to an illustrative embodiment of the present invention, it is possible to provide a comparator intended to reduce electric power consumption thereof.

Although comparators in illustrative embodiments of the present invention have been described above, the present invention is not limited to specifically disclosed embodiments and it is possible to apply a variety of alterations or modifications thereto, without departing from the claims.

All examples and conditional language provided herein are intended for the pedagogical purposes of aiding the reader in understanding the invention and the concepts contributed by the inventor to further the art, and are not to be construed as limitations to such specially recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A comparator comprising:
a first comparison unit configured to compare an input signal with a first signal; and
a second comparison unit configured to compare the input signal with a second signal having a voltage value lower than a voltage value of the first signal in a case where a voltage value of the input signal is lower than the voltage value of the first signal and compare the input signal with a third signal having a voltage value higher than a voltage value of the first signal in a case where a voltage value of the input signal is higher than the voltage value of the first signal,
wherein the second comparison unit includes a first comparison circuit configured to compare the input signal with the second signal in a case where the voltage value of the input signal is lower than the voltage value of the first signal and a second comparison circuit configured to compare the input signal with the third signal in a case where the voltage value of the input signal is higher than the voltage value of the first signal,
wherein the first comparison unit includes a first differential pair circuit configured to include two transistors configured to be driven based on the input signal and the first signal, respectively, and two first inverters configured to be connected to respective output terminals of the first differential pair circuit, wherein the two first inverters are configured to output a complementary output signal based on a result of comparison between the input signal and the first signal,
wherein the first comparison circuit includes two first switches configured to be turned on based on an output signal of one of the two first inverters in a case where the voltage value of the input signal is lower than the voltage value of the first signal and be turned off based on the output signal of one of the two first inverters in a case where the voltage value of the input signal is higher than the voltage value of the first signal, and a second differential pair circuit including two transistors configured to be connected to the two first switches, respectively, and driven based on the input signal and the second signal, respectively, wherein the second comparison circuit includes two second switches configured to be turned on based on an output signal of the other of the two first inverters in a case where the voltage value of the input signal is higher than the voltage value of the first signal and be turned off based on the output signal of the other of the two first inverters in a case where the voltage value of the input signal is lower than the voltage value of the first signal, and a third differential pair circuit configured to include two transistors configured to be connected to the two second switches, respectively, and be driven based on the input signal and the third signal, respectively, and wherein the second comparison unit includes two second inverters configured to be connected to the first comparison circuit and the second comparison circuit, respectively, and includes two first reset switches configured to be driven depending on a clock for an operation of the first comparison unit and the second comparison unit and reset two outputs of the two first inverters, respectively, two second rest switches configured to be driven at a phase identical to that of the two first reset switches depending on the clock and reset two outputs of the two second inverters, respectively, and a third switch configured to be connected to a common terminal of the first differential pair circuit and be driven at a phase opposed to those of the two first reset switches and the two second reset switches depending on the clock.

2. The comparator as claimed in claim 1, further comprising:

two first terminals configured to output two outputs of the two first inverters, respectively; and two second terminals configured to output two outputs of the two second inverters, respectively, wherein outputs of the two first terminals and the two second terminals represent a result of comparison between the input signal and the first signal, the second signal, and the third signal.

3. The comparator as claimed in claim 2, further comprising:

a first NAND-type latch circuit configured to be provided with two input terminals connected to the two first terminals; and a second NAND-type latch circuit configured to be provided with two input terminals connected to the two second terminals.

4. The comparator as claimed in claim 2, further comprising:

a NAND circuit configured to be provided with two input terminals connected to the two second terminals and output an EOC signal representing an end of an operation of comparison.

5. The comparator as claimed in claim 1, further comprising:

a DTCK terminal configured to input a delay clock thereto wherein a clock for an operation of the first comparison unit and the second comparison unit is delayed;

a first NOR circuit configured to be provided with one input terminal connected to the DTCK terminal, another input terminal connected to one of the two first terminals, and output terminals connected to the two first switches; and a second NOR circuit configured to be provided with one input terminal connected to the DTCK terminal, another input terminal connected to another of the two first terminals, and output terminals connected to the two second switches.

* * * * *